United States Patent [19]

Marrs et al.

[11] Patent Number: 5,583,378
[45] Date of Patent: Dec. 10, 1996

[54] BALL GRID ARRAY INTEGRATED CIRCUIT PACKAGE WITH THERMAL CONDUCTOR

[75] Inventors: Robert C. Marrs, Scottsdale; Ronald J. Molnar, Phoenix, both of Ariz.

[73] Assignee: Amkor Electronics, Inc., Chandler, Ariz.

[21] Appl. No.: 245,146

[22] Filed: May 16, 1994

[51] Int. Cl.⁶ .................................................. H01L 23/10
[52] U.S. Cl. ........................ 257/710; 257/712; 257/718; 257/730
[58] Field of Search ........................... 257/700, 718, 257/710, 712, 713, 730

[56] References Cited

U.S. PATENT DOCUMENTS

| | | | |
|---|---|---|---|
| 3,926,746 | 12/1975 | Hargis | 204/15 |
| 4,681,656 | 7/1987 | Byrum | 156/645 |
| 4,792,646 | 12/1988 | Enomoto | 174/68.5 |
| 4,802,277 | 2/1989 | Root | 29/846 |
| 4,849,856 | 7/1989 | Funari et al. | 361/386 |
| 4,910,584 | 3/1990 | Mizuo | 357/81 |
| 4,970,579 | 11/1990 | Arldt et al. | 257/718 |
| 4,999,740 | 3/1991 | Ilardi et al. | 361/386 |
| 5,027,191 | 6/1991 | Bourdelaise et al. | 357/74 |
| 5,045,921 | 9/1991 | Lin et al. | 357/74 |
| 5,057,969 | 10/1991 | Ameen et al. | 361/386 |
| 5,115,964 | 5/1992 | Ameen et al. | 228/180.2 |
| 5,133,495 | 7/1992 | Angulas et al. | 228/180.1 |
| 5,136,366 | 8/1992 | Worp et al. | 357/72 |
| 5,153,385 | 10/1992 | Juskey et al. | 174/260 |
| 5,159,535 | 10/1992 | Desai et al. | 361/398 |
| 5,170,931 | 12/1992 | Desai et al. | 228/180.2 |
| 5,191,511 | 3/1993 | Sawaya | 257/700 |
| 5,203,075 | 4/1993 | Angulas et al. | 29/830 |
| 5,241,133 | 8/1993 | Mullen, III et al. | 174/52.4 |
| 5,261,155 | 11/1993 | Angulas et al. | 29/830 |
| 5,280,193 | 1/1994 | Lin et al. | 257/723 |
| 5,291,062 | 3/1994 | Higgins, III | 257/698 |
| 5,294,750 | 3/1994 | Sakai et al. | 257/712 |
| 5,332,864 | 7/1994 | Liang et al. | 174/52.4 |
| 5,345,106 | 9/1994 | Doering et al. | 257/796 |
| 5,357,672 | 10/1994 | Newman | 29/830 |
| 5,381,039 | 1/1995 | Morrison | 257/701 |
| 5,420,460 | 5/1995 | Massingill | 257/693 |

FOREIGN PATENT DOCUMENTS

| | | |
|---|---|---|
| 61-287152A | 12/1986 | Japan . |
| 63-143849A | 6/1988 | Japan . |
| 63-174341A | 7/1988 | Japan . |
| 5-102337A | 4/1993 | Japan . |
| 2115607 | 2/1983 | United Kingdom . |

*Primary Examiner*—William Mintel
*Assistant Examiner*—Roy Potter
*Attorney, Agent, or Firm*—Skjerven, Morrill, MacPherson, Franklin & Friel; Philip J. McKay; Alan H. MacPherson

[57] ABSTRACT

A ball grid array package and low cost method for manufacture of the same is disclosed herein. The ball grid array package includes a thermal conductor which is a linearly co-extensive outer layer of an interconnection substrate and forms the outer surface of the ball grid array package. An integrated circuit chip is positioned on the underside of the package in a well region. The well region is either formed directly in the interconnection substrate or is formed by the application of a dam. The well region is then filled with an insulating encapsulant material to a predetermined level.

40 Claims, 18 Drawing Sheets

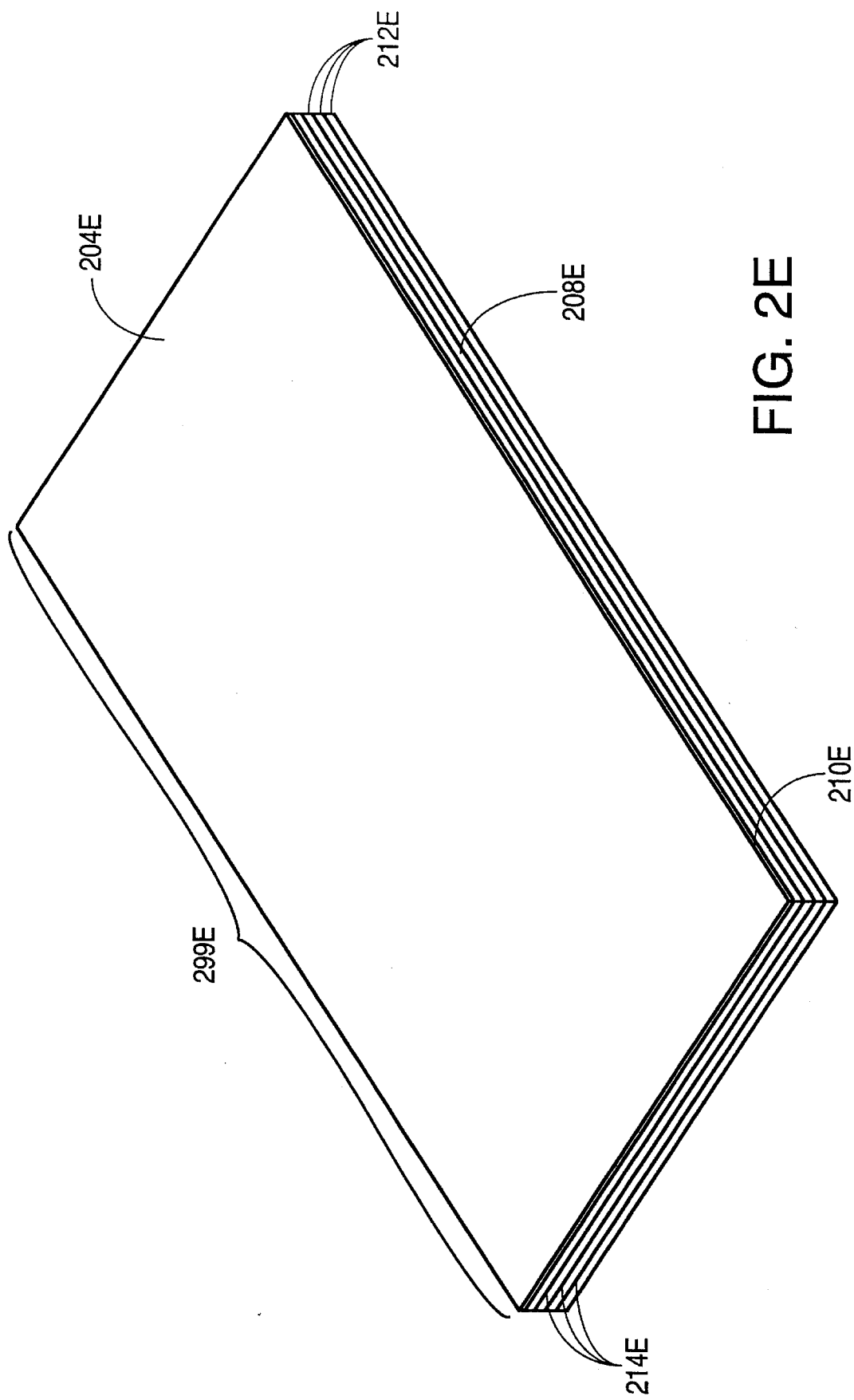

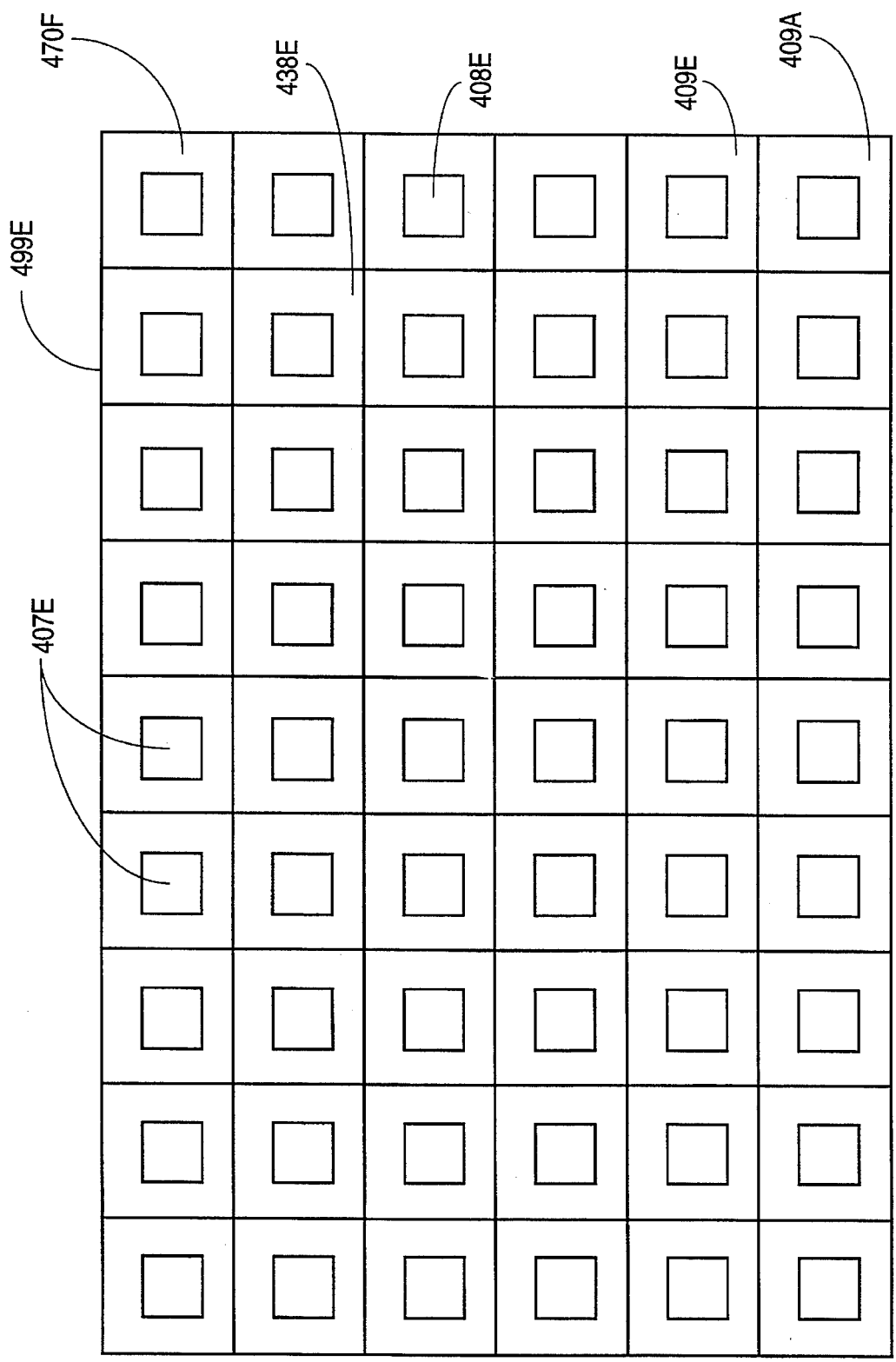
FIG. 4E2

5,583,378

1

BALL GRID ARRAY INTEGRATED CIRCUIT PACKAGE WITH THERMAL CONDUCTOR

RELATED APPLICATIONS

This application is related to a commonly assigned application entitled "BALL GRID ARRAY WITH VIA INTERCONNECTION" Ser. No. 08/047,721, filed Apr. 4, 1993 by Robert C. Marrs and Tadashi Hirakawa.

BACKGROUND OF INVENTION

1. Field of the Invention

This invention relates to electronic devices such as integrated circuits, hybrid circuits and multi-chip integrated circuit modules and in particular to low cost, high performance packages with enhanced thermal capabilities for the packaging of integrated circuit devices. More particularly, the invention relates to ball grid array packages incorporating an integral thermal conductor having an exposed outer surface.

2. Prior Art

Early generations of integrated circuit packages mounted the integrated circuit chip in a metal can or between a ceramic lid and base. Both ceramic and metal packaging provided excellent thermal properties. However, these packaging methods also necessitated expensive and time consuming manufacturing techniques.

As semiconductor production volumes grew, more cost effective packages were developed. The most notable was the plastic molded package. In particular, the plastic molded ball grid array package, such as described in U.S. Pat. No. 5,241,133 issued to Mullen III et al., on Aug. 31, 1993, and assigned to Motorola, Inc., has proven to be a promising packaging technique in terms of cost and input/output capability. Ball grid array packages are desirable because ball grid array packages eliminate difficulties in surface mounting prior art fine pitch plastic packages. Ball grid array packages also eliminate the need to route package leads to the outer edges of the integrated circuit package. Ball grid array packages also allow for smaller packages and very close spacing of packages mounted to the same printed circuit board. Finally, ball grid array packages provide shorter interconnect lengths which results in improved electrical performance. The advantages described above, along with the low cost of ball grid array packaging, make ball grid array packages an ideal packaging format for many integrated circuit applications. However, prior art ball grid array packages suffer from relatively poor heat dissipation characteristics. This means that this otherwise highly useful form of packaging can be impractical for use with newer generations of integrated circuit chips which use more power and thus generate considerable heat.

In recent developments, some ball grid array packages have been fitted with a separately formed and fitted heat sink in an attempt to improve the heat dissipation characteristics of the package. However, these ball grid array packages are difficult and expensive to manufacture. Further, the resulting packages are relatively thick and heavy which makes these ball grid array packages unsuitable for use in many electronics applications which require small size and light weight.

FIG. 1 is a cross-sectional view of a prior art ball grid array package 100 with integrated circuit chip 102. Prior art ball grid array package 100 includes a heat sink 104 which is attached to an interconnection substrate 108 with an adhesive preform 125. Heat sink 104 is typically a 1.0 to 1.6 millimeters thick metallic plate. As a result the overall package thickness 109 of prior art ball grid array package 100 is typically 2.3 to 3.7 millimeters.

While prior art ball grid array package 100 represents an improvement over some prior art ball grid array packages, at least in terms of heat dissipation, prior art ball grid array package 100 still suffers from several major drawbacks.

First, heat sink 104 only partially covers the outer surface 108A of interconnection substrate 108. The result of this configuration is that the heat generated by integrated circuit chip 102 is centralized within prior art ball grid array package 100 at the location of heat sink 104. Further, as heat sink 104 absorbs heat generated by integrated circuit chip 102, heat sink 104 expands. Since heat sink 104 is not linearly co-extensive with interconnection substrate 108, i.e., heat sink 104 only partially covers interconnection substrate 108, the expansion of heat sink 104 creates uneven stress on interconnection substrate 108 and prior art ball grid array 100. As a result of this uneven heat distribution and stress, the electrical connections between prior art ball grid array package 100 and a printed circuit mother board (not shown) often fail due to thermally induced stress cracks or metal fatigue. The electrical connections made by interior solder balls 118A are particularly vulnerable to thermal stress failure. These failures are a major problem because the electrical connections made by solder balls 118 and 118A allow prior art ball grid array package 100, and integrated circuit chip 102, to be utilized as part of a larger electronic structure and are therefore vital to the use of ball grid array packages in electronic systems using printed circuit boards.

Furthermore, as a result of the fact that heat sink 104 only partially covers interconnection substrate surface 108A, adhesive preform 125 is a weak point in the structure and the heat sink 104/substrate 108 junction 107 often provides a shortened path for contamination and moisture to enter the package. This type of contamination degrades the performance of integrated circuit chip 102 and compromises package reliability.

Prior art ball grid array package 100 is also complicated and expensive to manufacture because the process of attaching heat sink 104 requires complex individual unit positioning fixtures and tooling for centering heat sink 104, as well as a pressurized curing process. As a result, prior art ball grid array package 100 is typically produced as an individual unit because the heat sink 104 of prior art ball grid array package 100 does not lend itself to panel or strip format production. This adds considerably to the cost of producing prior art ball grid array package 100 and is a relatively time consuming and inefficient process.

Additionally, prior art ball grid array package 100 is a heavy and volume consuming integrated circuit package because heat sink 104 must be relatively thick (typically 1.0 to 1.6 millimeters) to present sufficient surface area for heat dissipation. Further, the minimum thickness of interconnection substrate 108 is limited to approximately 0.60 to 1.0 millimeters. This is because thinner interconnection substrate structures tend to warp causing difficulties in making electrical connections between prior art ball grid array package 100 and the mother board (not shown). The resulting thickness 109 of prior art ball grid array package 100 is typically 2.3 to 3.7 millimeters.

The weight and thickness of prior art ball grid array package 100 is particularly problematic in view of the increased demand for thinner and lighter packages which is driven by the "lap-top" "notebook" and "pocket" computer markets as well as cellular phones, hand held video games, and numerous other size and weight conscious applications which are coming onto the market every day.

It is therefore highly desirable to provide a lower cost ball grid array package, and method for creating and mass producing the same, which has superior heat dissipation characteristics, small size, light weight, and avoids the structural problems associated with prior art ball grid array packages.

SUMMARY OF THE INVENTION

The present invention discloses packaged integrated circuit devices which incorporate low cost ball grid array packages with thermal conductors and methods for creating these ball grid array packages. The ball grid array packages disclosed have improved heat dissipation characteristics, are thin and light weight, and solve the structural problems of prior art ball grid array packages.

One embodiment of the invention is a ball grid array packaged integrated circuit device including an interconnection substrate having at least one layer of conductive trace material and at least one layer of insulating material formed in or on the interconnection substrate. The interconnection substrate also has a first surface and a second surface. The second surface of the interconnection substrate includes a plurality of electrical contacts that are electrically connected to at least one layer of conductive trace material. These electrical contacts can have solder balls attached for electrical connection of the ball grid array package to a printed circuit mother board.

A thermal conductor is attached to the interconnection substrate. The thermal conductor has a first surface which is attached to the first surface of the interconnection substrate. The thermal conductor has a second surface, opposite the first surface, which is exposed to the exterior of the ball grid array package. The thermal conductor is linearly co-extensive with the first surface of the interconnection substrate and therefore covers the entire first surface of the interconnection substrate.

The interconnection substrate also includes a well region formed in the second surface of the interconnection substrate. The well region in the interconnection substrate has a bottom comprising an exposed portion of the thermal conductor first surface.

An integrated circuit chip is positioned in this well region so that the second surface of the integrated circuit chip is attached to the exposed portion of the first surface of the thermal conductor at the bottom of the well region.

The integrated circuit chip is electrically connected to at least one layer of conductive trace material formed in or on the interconnection substrate with a plurality of conductive bond wires.

The well region of the interconnection substrate can be filled to a predetermined level with an insulating encapsulant material to protect and seal the integrated circuit chip.

An optional lid can be positioned and attached to the second surface of the interconnection substrate so that the lid covers the well region of the interconnection substrate, the integrated circuit chip, and the plurality of conductive bond wires.

In a another embodiment of the invention, a dam can be positioned around the perimeter of the well region of the interconnection substrate to contain the insulating encapsulant material. In this way, a thinner interconnection substrate can be used which has a single layer of insulating material and a single layer of conductive trace material. The dam can be a plastic resin or a tape applied to the second surface of the interconnection substrate.

A lid can be used with this embodiment as well. The lid is positioned and attached to the dam so that the lid covers the dam, the well region of the interconnection substrate, the integrated circuit chip, and the plurality of conductive bond wires.

In a another embodiment of the invention, the integrated circuit is positioned in a well region of the interconnection substrate so that the first surface of the integrated circuit chip is attached in a flip chip configuration to at least one layer of conductive trace material formed in or on the interconnection substrate at the bottom of the well region.

In this embodiment the well region of the interconnection substrate can likewise be filled to a predetermined level with an insulating encapsulant material.

As with the other embodiments, a lid can be used with this embodiment. In this embodiment, the lid is positioned and attached to the second surface of the interconnection substrate to cover the well and the integrated circuit chip.

The ball grid arrays described above have several advantages over the prior art. First, because the thermal conductor covers the entire outer surface of the interconnection substrate, and the ball grid array package, heat generated by the integrated circuit chip is spread more evenly across the entire outer surface of the ball grid array package. As a result, the heat is not concentrated in the center of the package as it was with prior art ball grid array packages. Thus, the thermal stress associated with prior art ball grid array packages is minimized. Further, spreading the heat evenly over the outer surface of the ball grid array package not only improves heat dissipation to the outside environment but, it also dissipates the heat more evenly and readily into the interconnection substrate and the printed circuit mother board.

In addition, since the thermal conductor constitutes the entire outer surface of the ball grid array package of this invention, the thermal conductor has a maximum horizontal surface area exposed. This allows the thermal conductor to be very thin (typically 0.127 to 0.254 millimeters thick) and yet efficiently dissipate more heat from the integrated circuit chip to the outside of the package. This is in contrast to prior art ball grid array packages, whose heat sink was typically 1.0 to 1.6 millimeters thick. The fact that the thermal conductor is relatively thin also decreases the cost and overall weight and thickness of the disclosed ball grid array package as compared to prior art packages. Further, prior art ball grid array packages have interconnection substrates which are typically no thinner than 0.60 millimeters. This is because thinner structures would warp, creating difficulties in forming good electrical interconnections with the mother board. However, by applying the thermal conductor as a linearly co-extensive layer of the interconnection substrate of the disclosed ball grid array package, the thermal conductor serves to strengthen and support the interconnection substrate. As a result, the interconnection substrate can be thinner, approximately 0.36 millimeters, without warping. Thus, with a thinner interconnection substrate, the ball grid array package of the invention can not only be made thinner than prior art ball grid array packages with heat sinks, but the ball grid array package of the invention can also be made thinner than prior art ceramic or plastic packages or ball grid array packages that have no heat sink at all. The ball grid array package of this invention is therefore an ideal package for use with new, smaller, electronic products which stress compact size and also incorporate newer generations of integrated circuit chips which require greater heat dissipation.

Further, because with the present invention the thermal conductor covers the entire outer surface layer of the ball grid array package, there is no shortened path for contamination such as junction 107 of prior art ball grid array package 100 (FIG. 1). This gives the ball grid array package of this invention improved package integrity and reliability.

The ball grid array package of this invention also has improved electrical performance because the thermal conductor acts as a close proximity ground plane across the top of the ball grid array package and thus reduces signal lead inductance. Electrical performance is also enhanced with the ball grid array packages disclosed because the thermal conductor covers the entire outer surface of the package and can be metallic, i.e., copper, thus the thermal conductor can act as a shield against unwanted electro-magnetic radiation. Thus, the thermal conductor significantly reduces electromagnetic interference with and from the integrated circuit chip. This is a particularly important advantage because the emphasis on small size and use of higher frequency devices in modern electronic products results in the very close spacing of signal processing components which can cause electro-magnetic interference problems.

Finally, by attaching the integrated circuit chip within a well region, a cavity is created around the integrated circuit chip which allows for the introduction and containment of an insulating encapsulant material. The resulting ball grid array package of this invention is therefore inexpensive to produce and provides effective protection of the integrated circuit chip and its system of electrical connection.

In yet another embodiment of a ball grid array packaged integrated circuit device in accordance with the invention, instead of creating a well in the interconnection substrate, a dam is applied to the second surface of the interconnection substrate.

A first surface of the integrated circuit chip is then attached in a flip chip configuration to at least one layer of conductive trace material on the second surface of the interconnection substrate. The dam is positioned around the perimeter of the integrated circuit chip, thus creating a well region around the integrated circuit chip. As with the dams described above, the dam of this embodiment of the invention can be a plastic resin or a tape applied to the second surface of the interconnection substrate.

The well region, created by the dam, around the integrated circuit chip, can filled to a predetermined level with an underfill epoxy and/or insulating encapsulant material.

As with the embodiment of the invention described above, a lid can be positioned and attached to either the second surface of the interconnection substrate or the dam, such that the lid, along with the dam or second surface of the interconnection substrate, surrounds the integrated circuit chip.

This embodiment of a ball grid array package in accordance with the invention has all the advantages of the other ball grid array packages of this invention described above. Furthermore, since this ball grid array package includes a dam, it is not necessary to form a well region. This feature allows the ball grid array package to have a minimal thickness on the order of 0.65 millimeters. Thus, the designer of a product incorporating the disclosed ball grid array package has maximum flexibility in terms of space utilization. This makes this embodiment of a ball grid array package in accordance with the invention ideal for use in modern electronic products which emphasize small size and light weight.

The ball grid array packages in accordance with the invention described above can be produced by low cost methods through incorporation and utilization of machinery and infrastructure already existing in the integrated circuit packaging and printed circuit board industries.

One such method involves forming a panel of interconnection substrates having at least one layer of conductive trace material and at least one layer of insulating material formed in or on the panel of interconnection substrates. The panel of interconnection substrates has a first surface and a second surface, opposite the first surface. The second surface of the panel of interconnection substrates includes a plurality of electrical contacts that are electrically connected to at least one layer of conductive trace material.

Well regions are formed by either physically removing portions of the interconnection substrates from the second surface of the panel of interconnection substrates or applying dams to the second surface of the panel of interconnection substrates, or, for one embodiment described above, doing both.

A thermal conductor panel is then attached to the first surface of the panel of interconnection substrates to form a panel of package units. Each package unit includes one of the well regions in the second surface of the panel of interconnection substrates.

Next, the panel of package units is cut into strips which include two or more package units.

An integrated circuit chip is then positioned and attached in the well regions of each of the package units of the strips of package units. Electrical connections between the integrated circuit chip and at least one layer of conductive trace material, in or on the strips of package units, are then made.

The well regions in the strips of package units are then filled to a predetermined level with an insulating encapsulant material. Solder balls can also be attached to the plurality of electrical contacts on the second surface of the strips of package units at this stage of the method.

Finally, the strips of package units are cut into individual packaged integrated circuit devices.

The method described above, combines the cost effective features of both printed circuit board and plastic packaging techniques. The result is a method for producing ball grid array packages that are smaller, lighter, less expensive, more reliable, and can dissipate more heat than prior art ball grid array packages.

BRIEF DESCRIPTION OF THE DRAWINGS

FIGS. 2E–2J depict some of the key steps of one method for manufacturing ball grid array packaged integrated circuit chips in accordance with the invention.

DETAILED DESCRIPTION OF THE DRAWINGS

Figures 2A, 2K:
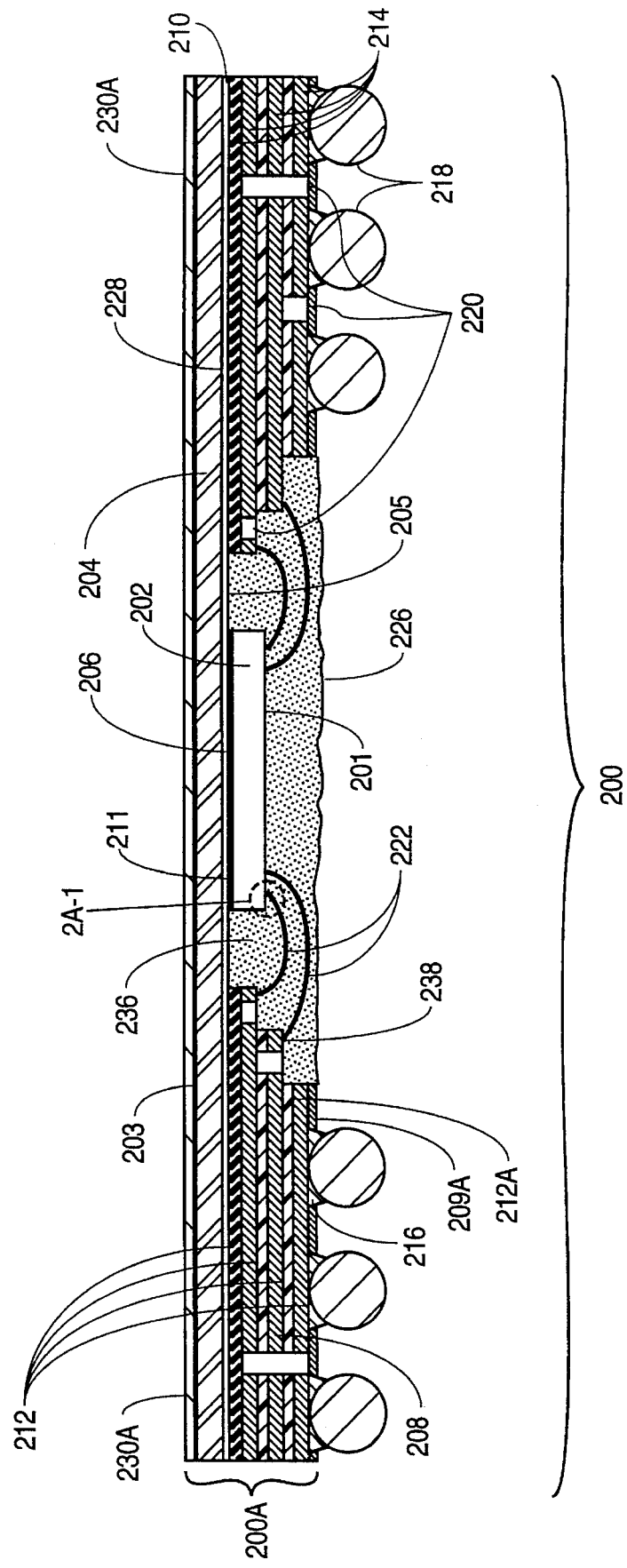
FIG. 2A is a cross-sectional view of a wire bond version of a ball grid array package 200 with integrated circuit chip 102 and thermal conductor 204 in accordance with the invention.
FIG. 2K illustrates enlarged portion 2A-1 of FIG. 2A which details an integrated circuit chip contact pad 224 and a bonding wire 222.

FIG. 2A is a cross-sectional view of a wire bond version of a ball grid array package 200 with integrated circuit chip 202 and thermal conductor 204 in accordance with the invention.

Integrated circuit chip 202 has a first surface 201 with integrated circuit chip contact pads 224. Integrated circuit chip contact pads 224 allow for external connections with integrated circuit chip 202. Integrated circuit chip 202 has a second surface 211 which is attached with adhesive 206 to thermal conductor 204 on its underside or first surface 205. Integrated circuit chip 202 can be attached to thermal conductor 204 by any one of several adhesives 206, well known in the art, including silver filled epoxy. Silver filled epoxy is particularly advantageous because of its superior thermal dissipation properties; however, any suitably strong adhesive method could be used.

Thermal conductor 204 is a thin, typically 0.127 to 0.254 millimeters thick, layer of spring temper copper covering the entire outer surface of ball grid array package 200. Of course, thermal conductor 204 can be made of other similarly stiff and thermally conductive materials.

As described in more detail below, thermal conductor 204 is applied to interconnection substrate 208 by adhesive layer 210 and is linearly co-extensive with interconnection substrate 208. Therefore, thermal conductor 204 is the integral outermost layer of interconnection substrate 208. This structure has several advantages which are also described in more detail below.

An optional adhesion layer 228 can be created, by methods well known to those of skill in the art, on first surface 205 of thermal conductor 204. In one embodiment adhesion layer 228 is a black oxide layer. Adhesion layer 228 enhances the adhesion of interconnection substrate 208, integrated circuit chip 202, and insulating encapsulant material 226 to thermal conductor first surface 205. Further, adhesion layer 228 can improve integrated circuit chip 202 reliability by increasing package resistance to moisture ingress and resulting ionic contamination and corrosion. An optional protective layer 230A of epoxy resin or another suitable material can also be applied to the second surface 203 of thermal conductor 204.

In one embodiment, a portion of thermal conductor first surface 205 is exposed at the bottom of well region 236. Integrated circuit chip 202 is then attached directly to thermal conductor first surface 205 at the bottom of well region 236 with adhesive 206. This configuration provides direct dissipation of heat away from integrated circuit chip 202.

In well region 236, integrated circuit chip 202 is surrounded by interconnection substrate 208. Interconnection substrate 208 is a multi-layer printed circuit board laminate. Insulating layers 214 can be made of prepreg layers created with bizmaleimide triazine (BT) resin materials using printed circuit board fabrication methods well known to those of skill in the art. BT prepreg layers are available from Mitsubishi Gas and Chemical Company of Japan. Conductive trace layers 212 are created by methods well known to those of skill in the art such as photo lithography, etching, and black oxide treatment of thin layers of copper. Insulating layers 214 and conductive trace layers 212 are laminated together with epoxy resin (not shown). Conductive vias or plated through holes 220 can then be drilled, or laser ablated, and plated to form conductors for electrical connections between the various conductive trace layers 212.

The number of insulating layers 214, conductive trace layers 212, and conductive vias or plated through holes 220 employed depends on the type of integrated circuit chip 202 used, the electrical design requirements, and the number of circuit interconnections required.

Figure 2C:
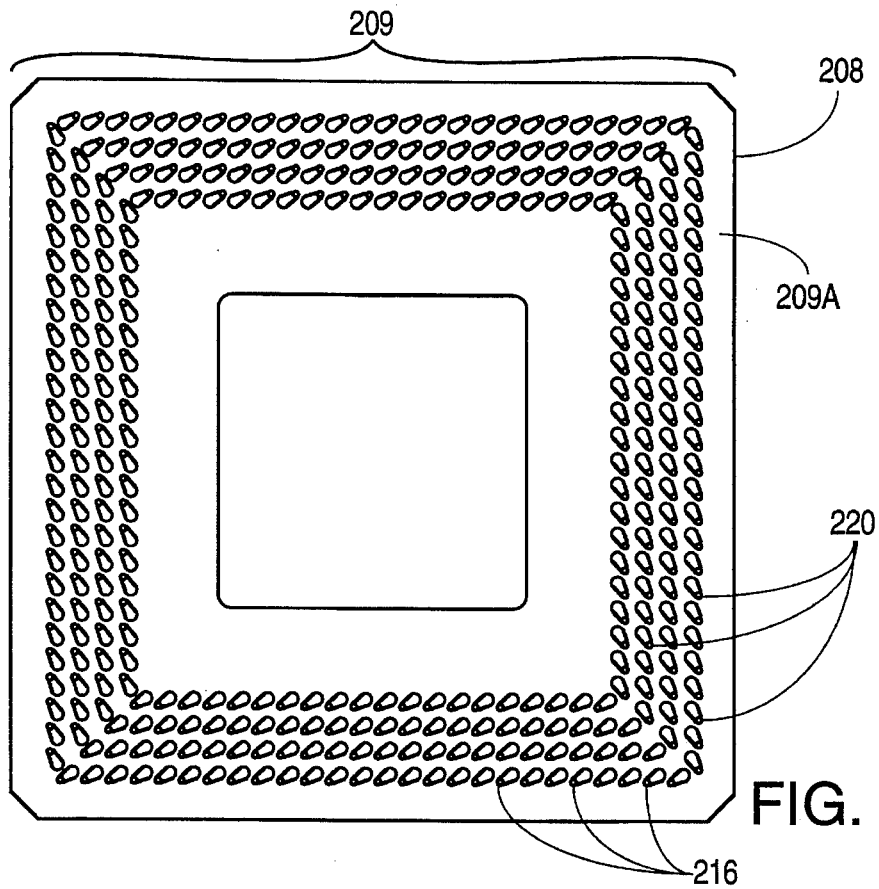
FIG. 2C is a bottom plan view of electrical contacts 216 on second surface 209 of interconnection substrate 208 of ball grid array package 200.
Figure 2B:
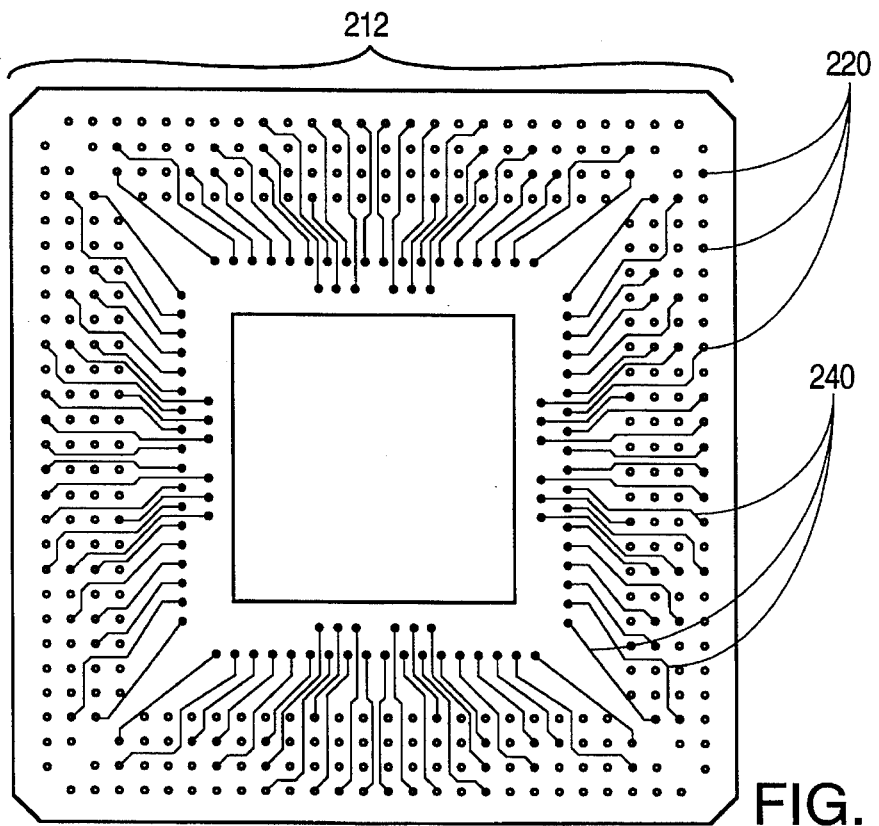
FIG. 2B is a bottom plan view of a typical conductive trace layer 212 including conductive traces 240 and conductive vias or plated through holes 220.

FIG. 2B is a bottom plan view of a typical conductive trace layer 212 including conductive traces 240 and conductive vias or plated through holes 220.

An insulating solder mask layer 209A is applied over the outermost conductive trace layer 212A. Electrical contacts 216 are then formed by creating selective openings in solder mask layer 209A, by methods well known to those of skill in the art, thereby exposing selected portions of conductive trace layer 212A. These exposed portions of conductive trace layer 212A are then plated with nickel and gold to form electrical contacts 216. Electrical contacts 216 are connected to integrated circuit chip contact pads 224 by conductive trace layers 212, conductive vias or plated through holes 220 and bond wires 222. Each electrical contact 216 can correspond to a selected integrated circuit chip contact pad 224. FIG. 2K shows an enlarged view of contact pad 224 with bonding wire 222 connected thereto.

FIG. 2C is a bottom plan view of ball grid array package 200 showing solder mask layer 209A on second surface 209 of interconnection substrate 208, electrical contacts 216, and conductive vias or plated through holes 220.

By attaching solder balls 218 (FIG. 2A) to electrical contacts 216, ball grid array package 200 can be made ready for solder, welding, conductive adhesive attachment, or other means of electrical connection to a larger electronic system such as a printed circuit mother board (not shown). In another variation of ball grid array package 200, socket connections could be used instead of solder balls 218 to electrically connect ball grid array package 200 to the mother board or larger system.

Ball grid array package 200 (FIG. 2A) is a wire bond version of a ball grid array package in accordance with the present invention. Therefore, the electrical connections between integrated circuit chip contact pads 224 and bonding locations 238, on conductive trace layers 212, are made with bond wires 222. This type of interconnection is well known in the art and involves running a metallic bond wire 222 from integrated circuit chip contact pads 224 directly to predetermined bonding locations 238 on conductive trace layers 212. Each integrated circuit chip contact pad 224 connected has its own individual bond wire 222.

As described above, integrated circuit chip 202 is positioned in well region 236. Well region 236 can then be filled to a predetermined level with an insulating encapsulant material 226 which, in one embodiment, is an epoxy based plastic resin. Insulating encapsulant material 226 encapsulates bond wires 222, and at least part of integrated circuit chip 202, thereby protecting integrated circuit chip 202 and bond wires 222 from the outside environment.

FIGS. 2E–2J depict some of the key steps of one method for manufacturing ball grid array package 200 in accordance with the invention. The method depicted in FIGS. 2E–2J can be performed using the existing machinery and infrastructure of the printed circuit board and plastic integrated circuit packaging industries. Furthermore those of skill in art will recognize that other methods for manufacturing ball grid packages such as a reel to reel printed circuit board manufacturing could be employed.

First, large panels 208E (FIG. 2E), typically 22.86 centimeters by 30.48 centimeters (9" by 12") or larger, of interconnection substrates 208 (FIG. 2A) are formed. The desired number of insulating layers 214E, conductive trace layers 212E, and conductive vias or plated through holes 220 (not shown in FIG. 2E, see FIG. 2A) are created by the lamination and drilling methods described above. Since these techniques are well known to those of skill in the art, a detailed description of them is omitted here so as not to detract from the description of the invention.

Well regions 236F (FIG. 2F) are formed in second surface 209F of panel of interconnection substrates 208E by punching, laser ablating, routing, or any one of several other methods known in the art for creating wells in interconnection substrate. To produce ball grid array 200, well regions 236F are punched, ablated, or routed completely through panel of interconnection substrates 208E such that when thermal conductor panel 204E (FIG. 2E) is attached with adhesive layer 210E, a portion of thermal conductor panel first surface (not shown in FIG. 2E) is exposed at the bottom of each well 236F.

Then thermal conductor panel 204E is attached to panel of interconnection substrates 208E by adhesive layer 210E (See FIGS. 2A and 2F) to form a panel of package units 299E (also called panel 299E). Thermal conductor panel 204E is a thin, typically 0.127 to 0.254 millimeters thick, sheet which is made of spring temper copper. FIG. 2E shows one perspective of panel 299E including thermal conductor panel 204E, adhesive layer 210E, and panel of interconnection substrates 208E with insulating layers 214E, and conductive trace layers 212E. Solder mask layer 209AF (FIG. 2F) is also part of panel 299E but is not shown in FIG. 2E. As described above, thermal conductor panel 204E can also include an adhesion layer of black oxide or another suitable material (also not shown).

Figure 2D:
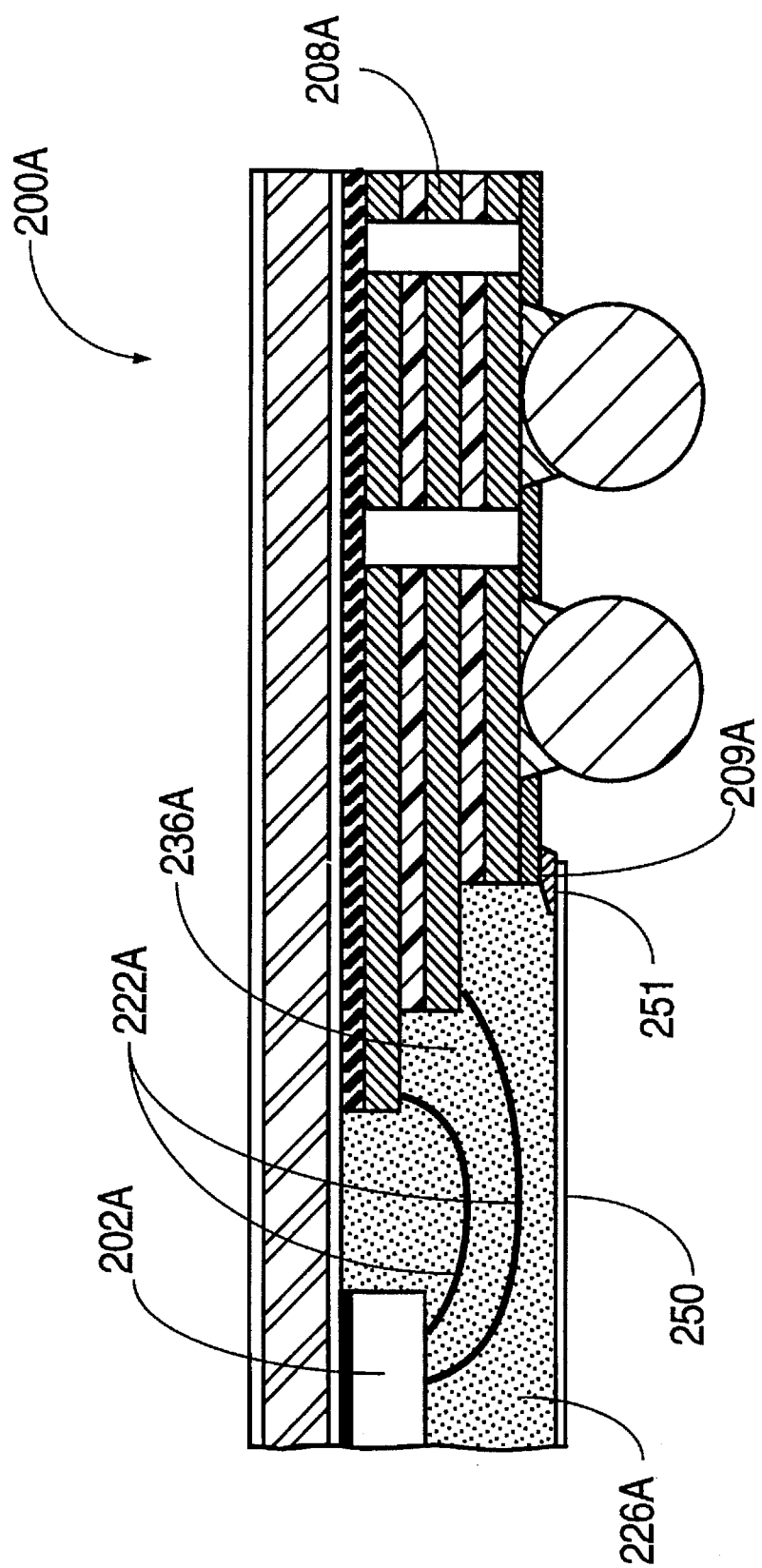
FIG. 2D is a partial, cross-sectional view of a second embodiment of a wire bond version of ball grid array package 200A with integrated circuit chip 102A and thermal conductor 204A in accordance with the invention which includes lid 250.
Figure 2F:
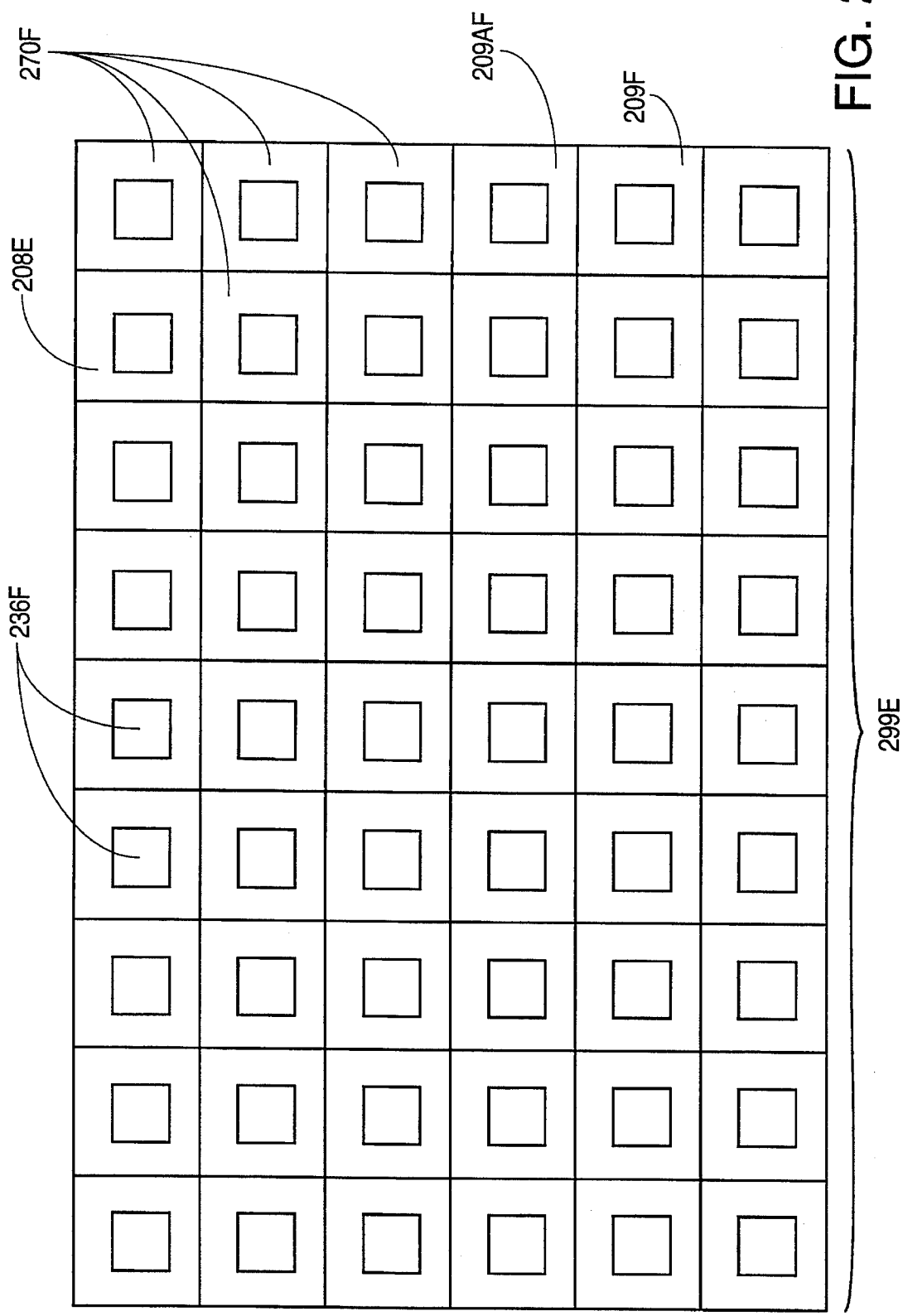
Figure 2G:
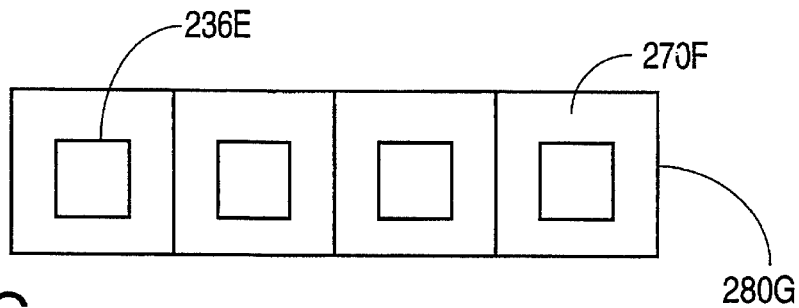
Figure 2H:
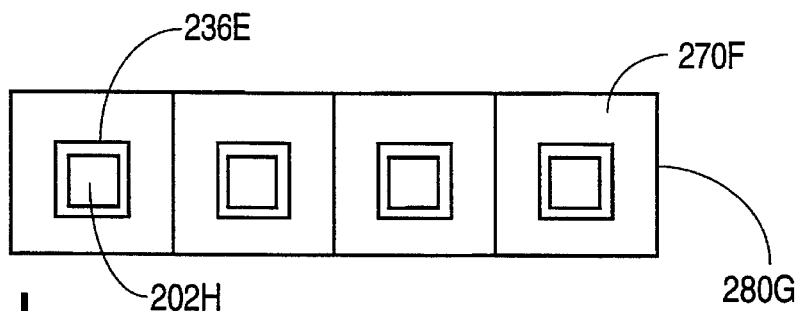
Figure 2I:
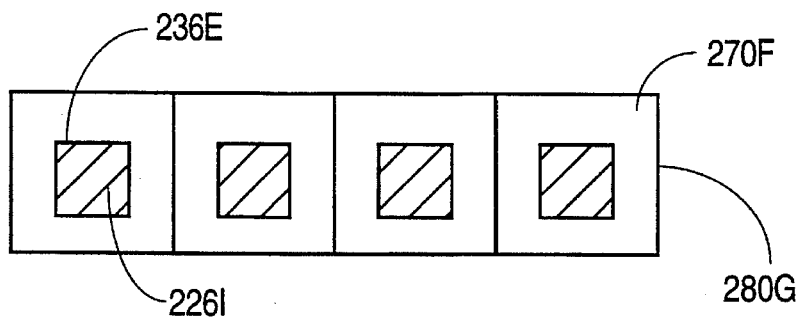
Figure 2J:
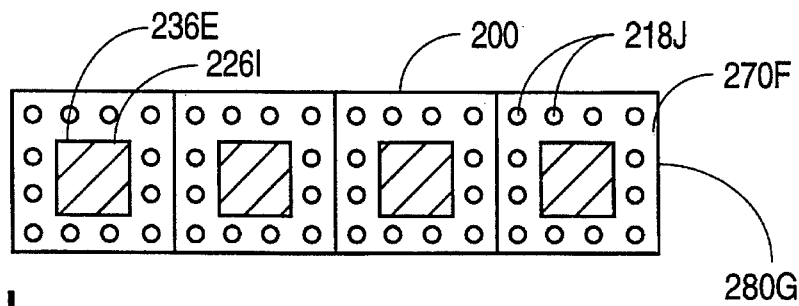

FIG. 2F shows second surface 209F of panel 299E which is covered by solder mask layer 209AF. At this stage of production, panel 299E consists of empty ball grid array package units 270F, including well regions 236F. Panel 299E is then formed into strips of package units 280G (also referred to as strips 280G) (FIG. 2G). Strips 280G are punched or routed out of panel 299E by techniques well known in the art. Strips 280G typically include between 4 and 40 package units 270F and typically measure 5.08 centimeters by 22.86 centimeters (2" by 9"). Once strips 280G are created, integrated circuit chips 202H (FIG. 2H) are attached to the bottom of each well region 236E of each unit 270F in strip 280G and, in one embodiment, are wire bonded for electrical connection (not shown). Then well regions 236E are filled with insulating encapsulant material 226I (FIG. 2I). If solder balls 218J are required, they are applied at this stage by methods described above and well known in the art (FIG. 2J).

Individual units 270G are then marked and punched out, thereby producing individual ball grid array packages 200 including integrated circuit chips 202 (FIG. 2A) in a cost effective and efficient manner.

The method described above is just one of many methods of creating ball grid array package 200 and should not be construed as limiting the invention. For instance, single package units 270F could be punched out directly from panel 299E or individual ball grid array packages 200 could be made, one at a time. However, these methods would be more costly, more time consuming, and require more specialized tooling than the method described above which is adaptable to existing equipment in the printed circuit board and integrated circuit packaging industries. Further, the dimensions of panel 299E and strips 280G were arbitrarily chosen for illustrative purposes only and can be larger or smaller than those listed above to accommodate different machinery or other needs of the manufacturer. Finally, as described below, modifications can be made to the method described above to create different versions of ball grid array packages in accordance with the present invention.

As described above, thermal conductor 204 is applied, with adhesive layer 210, as the outer surface layer of interconnection substrate 208 and ball grid array package 200. This structure has several advantages. First, because thermal conductor 204 is linearly coextensive with interconnection substrate 208, and constitutes the entire outer surface layer of ball grid array package 200, heat generated by integrated circuit chip 202 is spread more evenly across the entire outer surface of ball grid array package 200. As a result, the heat is not concentrated in the center of the package as it was with prior art ball grid array package 100. Thus, the thermal stress associated with prior art ball grid array package 100 is minimized. Further, spreading the heat evenly over the outer surface of ball grid array package 200 not only improves heat dissipation to the outside environment but, it also dissipates the heat more evenly and readily into interconnection substrate 208 and the printed circuit mother board (not shown).

In addition, since thermal conductor 204 constitutes the entire outer surface of ball grid array package 200, thermal conductor 204 has a maximum horizontal surface area exposed. This allows thermal conductor 204 to be very thin (typically 0.127 to 0.254 millimeters thick) and yet efficiently dissipate more heat from integrated circuit chip 202 outside the package. This is in contrast to prior art ball grid array package 100, whose heat sink was typically 1.0 to 1.6 millimeters thick. The fact that thermal conductor 204 is relatively thin decreases the cost and overall weight and thickness 200A (FIG. 2A) of ball grid array package 200 as compared to prior art ball grid array package 100 and other prior art packages. Further, prior art ball grid array packages had interconnection substrates which were typically no thinner than 0.60 millimeters. This is because thinner structures would warp creating difficulties in forming good electrical connections with the mother board (not shown). However, by applying thermal conductor 204 as a linearly co-extensive, spring temper, copper layer of interconnection substrate 208, thermal conductor 204 serves to strengthen and support interconnection substrate 208. As a result, interconnection substrate 208 can be thinner, approximately 0.36 millimeters, without warping. Thus, with thinner interconnection substrate 208, ball grid array package 200 can not only be made thinner than prior art ball grid array package 100, but it can also be made thinner than prior art ceramic or plastic packages and ball grid array packages that have no heat sink at all. Ball grid array package 200 is therefore an ideal package for use with new, smaller, electronic products which stress compact size and, at the same time, incorporate newer generations of integrated circuit chips which require greater heat dissipation.

Figure 1:
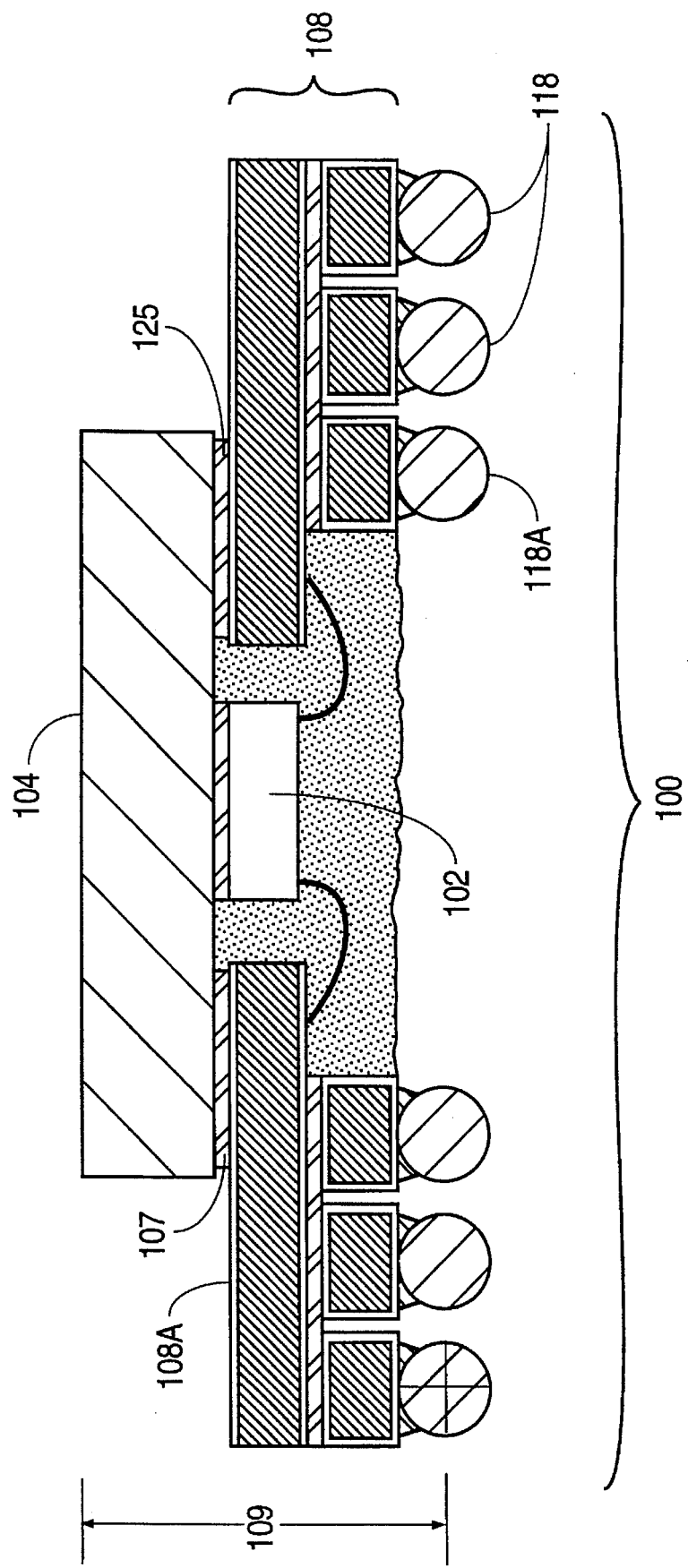
FIG. 1 is a cross-sectional view of a prior art ball grid array package 100 with integrated circuit chip 102 and heat sink 104.

Further, because thermal conductor 204 is a linearly co-extensive layer of ball grid array package 200, there is no shortened path for contamination such as junction 107 of prior art ball grid array package 100 (FIG. 1) because the junction of thermal conductor 204 and interconnection substrate 208 runs the entire length and width of the package. This gives ball grid array package 200 improved package integrity and reliability.

Ball grid array package 200 also has improved electrical performance because thermal conductor 204 acts as a close proximity ground plane across the top of ball grid array package 200 and thus reduces signal lead inductance. Electrical performance is also enhanced with ball grid array package 200 because thermal conductor 204, being metallic, i.e., copper and covering entire interconnection substrate outer surface acts as a shield against unwanted electromagnetic radiation. Thus, thermal conductor 204 significantly reduces electro-magnetic interference with and from integrated circuit chip 202. This is a particularly important advantage because the emphasis on small size and higher frequency devices in modern electronic products results in very close spacing of signal processing components.

Finally, by attaching integrated circuit chip 202 within well region 236, a cavity is created around integrated circuit chip 202 which allows for the introduction and containment of insulating encapsulant material 226. This provides for the encapsulation and protection of both integrated circuit chip 202 and bond wires 222. The resulting ball grid array package 200 is therefore inexpensive to produce and provides effective protection of integrated circuit chip 202 and its system of electrical connection.

FIG. 2D is an alternative embodiment 200A of ball grid array package 200. In this embodiment a lid 250 is attached to solder mask layer 209A of interconnection substrate 208A with adhesive 251. Lid 250 covers well region 236A, integrated circuit chip 202A, and bond wires 222A. Thus, integrated circuit chip 202A and bond wires 222A are protected from the outside environment. If necessary, well region 236A can also be filled with insulating encapsulant material 226A for even greater protection of integrated circuit chip 202A.

Figure 3:
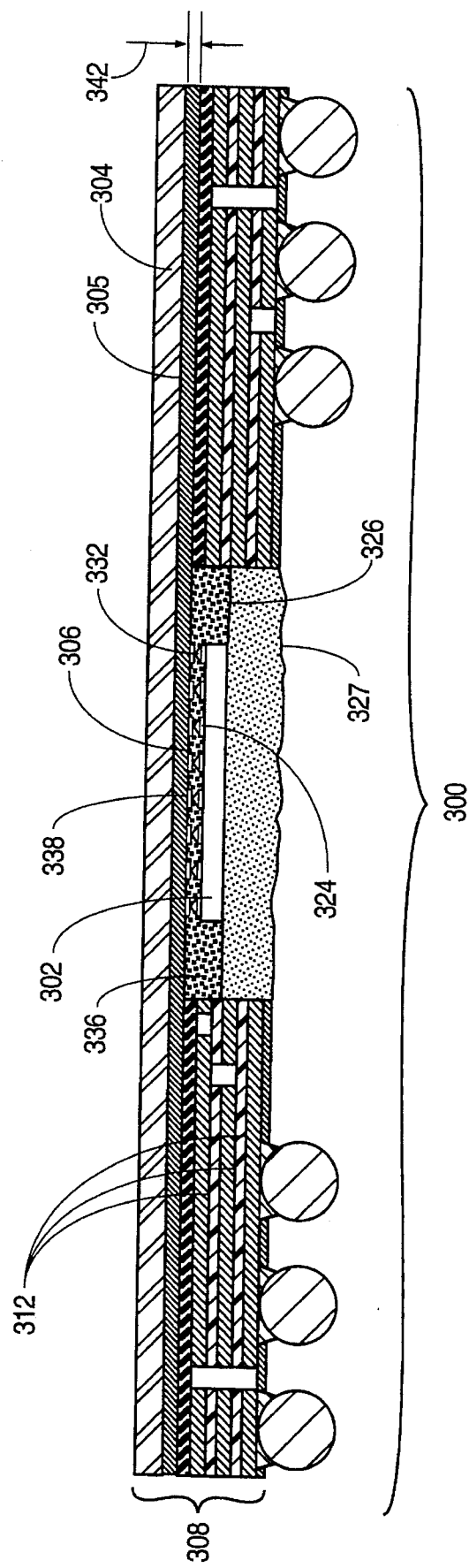
FIG. 3 is a cross-sectional view of a flip chip interconnect version of ball grid array package 300 with integrated circuit chip 302 and thermal conductor 304 in accordance with the present invention.

FIG. 3 is a cross-sectional view of a flip chip interconnect version of a ball grid array package 300 with integrated circuit chip 302 and thermal conductor 304 in accordance with the present invention. In this configuration integrated circuit chip contact pads 324 are placed in electrical contact with connection points 332 on a first conductive trace layer 338. Flip chip mounting of integrated circuit chips is well known to those of skill in the art, therefore a detailed description of flip chip mounting is omitted here so as not to detract from the invention.

An insulating layer 306 is applied with adhesive to thermal conductor first surface 305. Conductive trace layer 338 is then applied over insulating layer 306. In one embodiment, the two layers 306 and 338 are constructed by forming a copper conductive trace layer 338 on a thin film such as polyimide or Upilex film (Upilex film is manufactured by UBE Corp. of Japan). In this embodiment, the polyimide or Upilex film serves as insulating layer 306 and the combined thickness 342 of the two layers 306 and 338 is on the order of 35 to 75 microns. As a result, the two layers 306 and 338 present a minimal thermal barrier between integrated circuit chip 302 and thermal conductor 304. Multiple pairs of insulating layers 306 and conductive trace layers 338 can even be applied. It should be noted, however, that if too many layers 306 and 338 are applied, they can increase the thermal resistance between integrated circuit chip 302 and thermal conductor 304 and hinder heat dissipation from integrated circuit chip 302.

As with integrated circuit chip 202 (FIG. 2A), integrated circuit chip 302 is attached in a well region 336. Underfill epoxy material 326 is applied at the electrical interface between integrated circuit chip contact pads 324 and conductive trace layer 338 to protect and seal the electrical connection. Further, if more protection of integrated circuit chip 302 is desired, insulating encapsulant material 327 can be applied within well region 336 to any level desired.

The basic structure of ball grid array package 300 is the same as ball grid array package 200 and, therefore, ball grid array package 300 is constructed of similar materials and shares all the advantages over the prior art of ball grid array package 200. These construction materials and advantages are described in detail above. Additionally, with ball grid array package 300, the flip chip interconnect mounting of integrated circuit chip 302 allows integrated circuit chip 302 to be attached to interconnection substrate 308 and conductive trace material layers 312, through conductive trace layers 338 and 312, without the use of bond wires 222 (FIG. 2A). This configuration provides increased structural stability, (i.e. no bond wires to break), decreased production costs, (i.e. no bond wires to make and connect), improved electrical performance due to decreased resistance (i.e. more direct electrical connection without the inherent resistance of the bond wires themselves), and a lower profile structure because there are no bond wires to protect. Of course, this configuration does prevent integrated circuit chip 302 from being attached directly to thermal conductor 304. However, as described above, the added layers 338 and 306, between thermal conductor 304 and integrated circuit chip 302, create minimal interference with the heat dissipation capabilities of ball grid array package 300.

Ball grid array package 300 can be economically produced by making the following changes to the basic method described above with respect to ball grid array package 200:

1. adding a step for creating and applying insulating layer 306 and conductive trace layer 338 to thermal conductor 304 or, optionally, creating well region 336 such that a conductive trace layer 338 is at the bottom of well region 336;

2. Substituting flip chip interconnection of integrated circuit chip 302 for wire bond interconnection of integrated circuit chip 202 and thus eliminating the need for adhesive 206; and 3. Adding a step for applying underfill 326.

Therefore, ball grid array package 300, like ball grid array package 200, can be mass produced in panels and strips at a very low cost per unit.

Figure 4A:
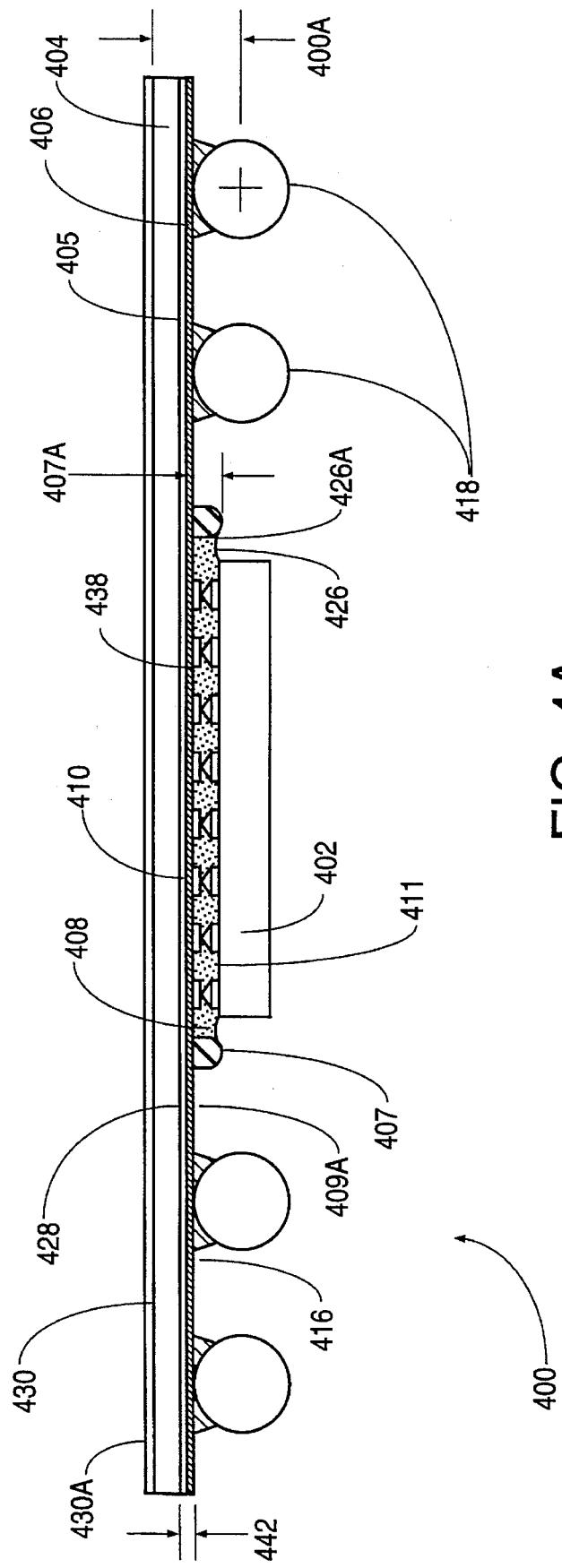
FIG. 4A is a cross-sectional view of a flip chip dam version of ball grid array package 400 with integrated circuit chip 402 and thermal conductor 404 in accordance with the invention.
Figure 4B:
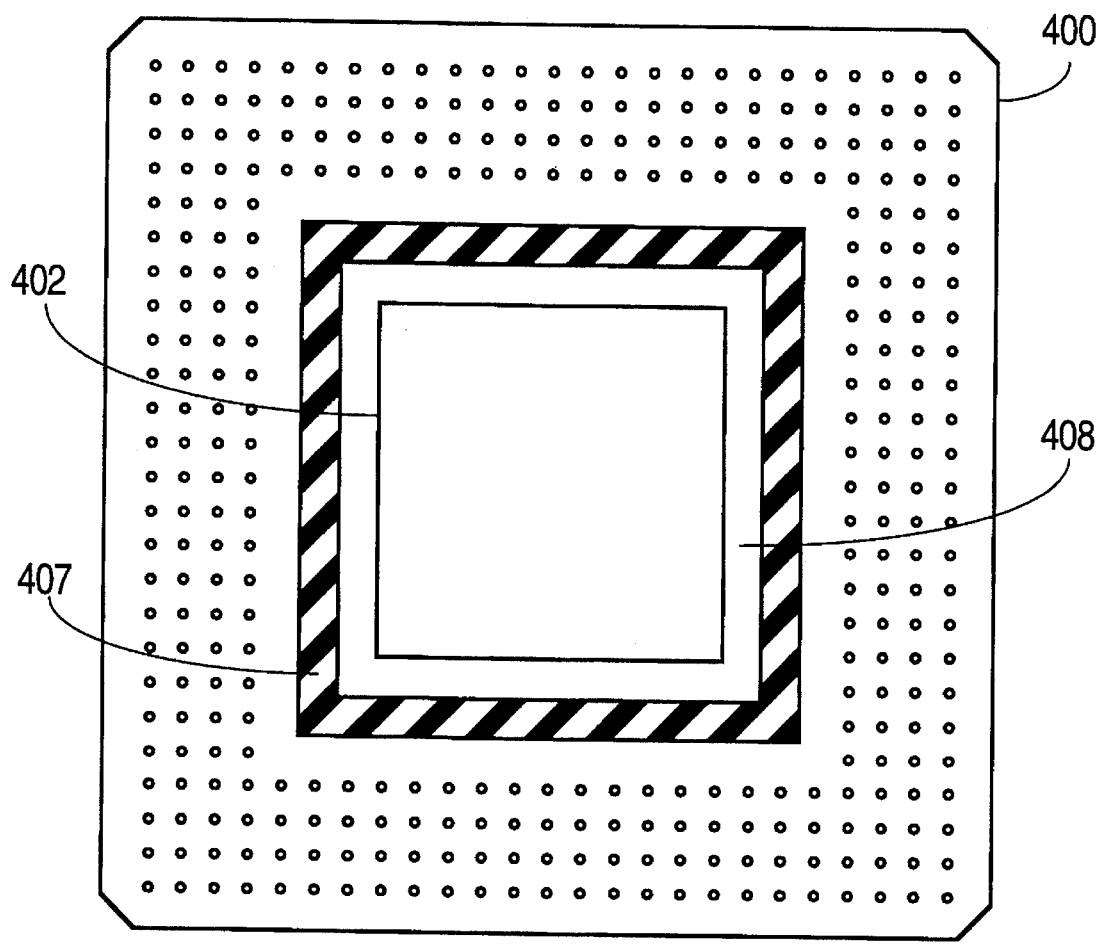
FIG. 4B is a bottom plan view of ball grid array package 400.
Figure 4C:
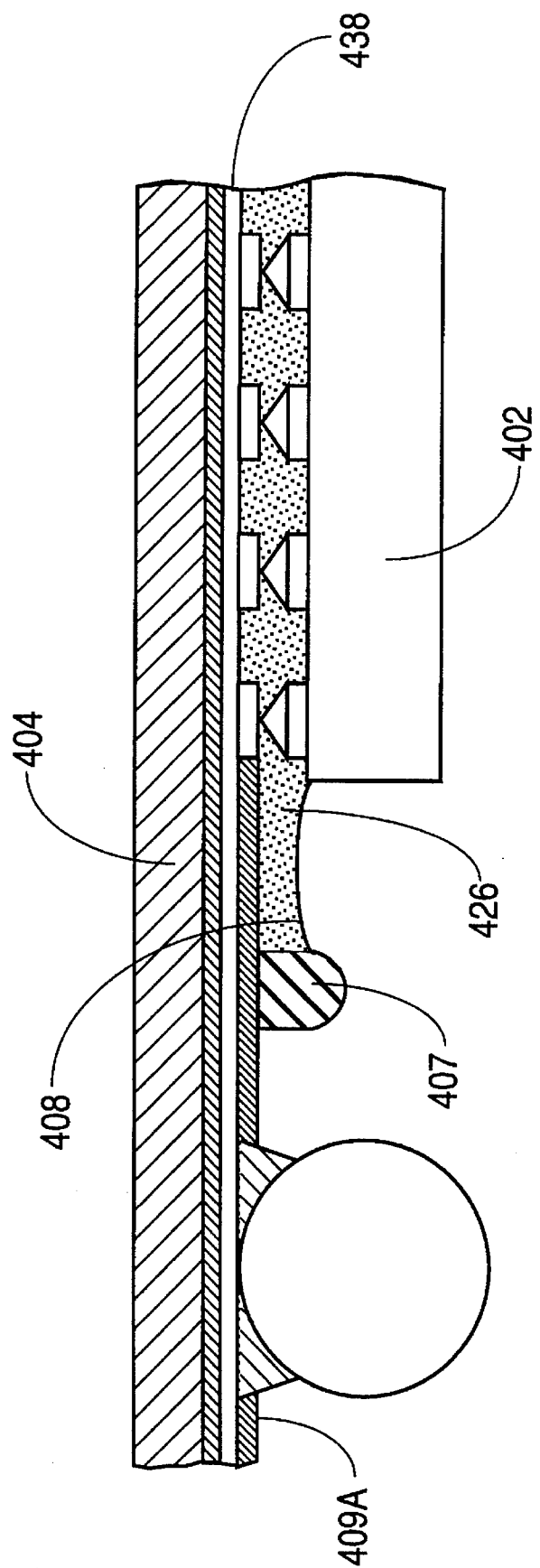
FIG. 4C is a detailed enlargement of the dam 407 and well region 408 of ball grid array package 400.

FIG. 4A is a cross-sectional view of a dam version of a ball grid array package 400 with thermal conductor 404 in accordance with the invention which uses flip chip interconnection of integrated circuit chip 402. FIG. 4B is a bottom plan view of ball grid array package 400. FIG. 4C is a detailed enlargement of the well region 408 of ball grid array package 400.

In the configuration of FIG. 4A, as with ball grid array package 300, an insulating layer 406 is applied to thermal conductor first surface 405 by adhesive layer 410. A conductive trace layer 438 is then applied over insulating layer 406. As described above with respect to ball grid array package 300, the two layers 406 and 438 can, in one embodiment, comprise copper conductive trace layer 438 applied on a thin polyimide or Upilex film 406. As also described above, in this embodiment, the film serves as insulating layer 406. As with ball grid array package 300, the combined thickness 442 of the two layers 406 and 438 is on the order of 35 to 75 microns and therefore does not represent a significant thermal barrier. As with the embodiments described above, the underside or first surface 405 of thermal conductor 404 can be coated with black oxide, or another suitable material, to form adhesion layer 428. A protective outer layer 430A of epoxy resin or other suitable material can also be applied to thermal conductor second surface 430 if desired.

Like integrated circuit chip 302 (FIG. 3), integrated circuit chip 402 is configured for flip chip interconnect attachment. In addition, a dam 407 is applied to solder mask layer 409A around integrated circuit chip 402. Dam 407 is used to contain underfill epoxy material 426 as described below. Dam 407 is shown in detail in FIGS. 4B and 4C.

FIG. 4B is an underside view of ball grid array 400. Dam 407 is drawn as a square in FIG. 4B, however, shapes other than squares can be used so long as integrated circuit chip 402 is surrounded and well region 408 is thereby formed to contain underfill epoxy material 426 (not shown in FIG. 4B).

Dam 407 can be created by any of several methods such as, a screening process, dispensing plastic or other material from a pressurized syringe, applying a molded plastic structure, or by simply applying tape. The manner of creating dam 407 will depend on volumes being produced, cost, existing machinery used, and the depth 407A (FIG. 4A) of well region 408 desired.

As shown above, dam 407 creates a well region 408 around integrated circuit chip 402. In one embodiment, well region 408 is filled with underfill epoxy material 426 to a desired level 426A. The level 426A of underfill epoxy material 426 can vary from below second surface 411 of integrated circuit chip 402 to the height of dam 407 itself.

Conductive trace layer 438 has electrical contacts 416 which, in one embodiment, provide for attachment of solder balls 418 (FIG. 4A) or other means for forming electrical connection with a printed circuit mother board (not shown). As described above electrical contacts 416 are formed by applying a solder mask layer 409A over conductive trace layer 438 and creating openings to expose selected portions of conductive trace layer 438 which are then plated with nickel and gold.

FIG. 4C is a blow-up view of a portion of thermal conductor 404, conductive trace material layer 438, well region 408, dam 407, underfill epoxy material 426, solder mask layer 409A, and integrated circuit chip 402, of ball grid array package 400.

Ball grid array package 400 has all the advantages of ball grid array packages 200 and 300 described above. Furthermore, since ball grid array package 400 includes dam 407, it is not necessary to separately form well region 408, as was the case with ball grid array packages 200 and 300. In addition to cost savings, i.e., less materials used, this feature also allows ball grid array package 400 to have a minimal thickness 400A (FIG. 4A). Thickness 400A is determined by dam height 407A. Dam height 407A is in turn manufacturer selected and is determined by the level 426A of underfill epoxy 426 dam 407 is required to contain. Therefore, when minimal protection is required, i.e. only the integrated circuit chip 402/conductive trace layer 438 interface needs to be encapsulated, thickness 400A (FIG. 4A) can be as small as the combined thickness of thermal conductor 404, insulating layer 406, conductive trace layer 438, solder mask layer 409A and integrated circuit chip 402. The resulting minimal thickness 400A is on the order of 0.65 millimeters. Thus, the designer of a product incorporating ball grid array package 400 has maximum flexibility in terms of space utilization. This makes ball grid array package 400 ideal for use in modern electronic products which emphasize small size, light weight, and incorporate new generations of integrated circuit chips 402 which require improved thermal dissipation for enhanced electrical performance.

Figure 4D:
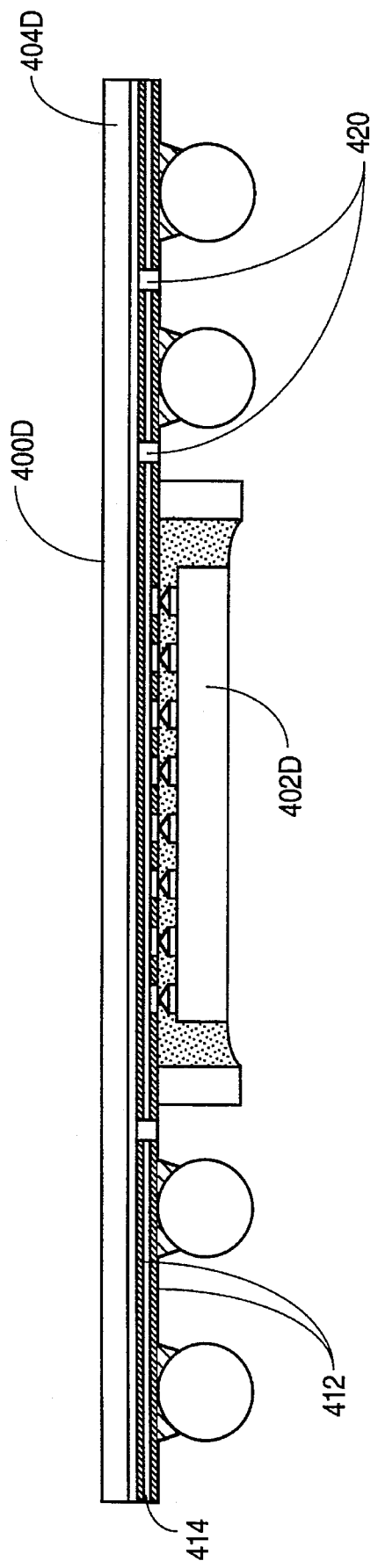
FIG. 4D is a cross-sectional view of a second embodiment of a dam version of ball grid array package 400D with integrated circuit chip 402D and thermal conductor 404D in accordance with the present invention.

FIG. 4D is a cross-sectional view of a second embodiment of a dam version ball grid array package 400D with integrated circuit chip 402D and thermal conductor 404D in accordance with the present invention. Ball grid array package 400D is identical to ball grid array package 400 except that ball grid array package 400D includes two conductive trace layers 412, insulating layer 414 and conductive vias or plated through holes 420. Insulating layer 414 and conductive trace layers 412 can consist of copper conductive trace layers 412 on a polyimide or Upilex film, as described above. Other methods, known in the art, of forming conductive trace layers, conductive vias or plated through holes, and insulating layers can also be used. However, as described above, it should be noted that the number of layers employed will be limited by the heat dissipation required.

Ball grid array packages 400 and 400D can be produced in panels by a method similar to the methods described above with respect to ball grid array packages 200 and 300. FIGS. 4E–4I depict some of the key steps of one method for manufacturing ball grid array package 400 in accordance with the invention.

A panel of interconnection substrates 498E (FIG. 4E) is created by lamination and fabrication techniques well known in the art and described above with respect to ball grid array package 200. As with panel of interconnection substrates 208E, the size of panel of interconnection substrates 498E is variable but a 22.86 centimeter by 30.48 centimeter (9" by 12") panel would be typical. Panel of interconnection substrates 498E includes insulation layer 406E and conductive trace layer 438E (FIG. 4E) and a solder mask layer 409A.

Figure 4E:
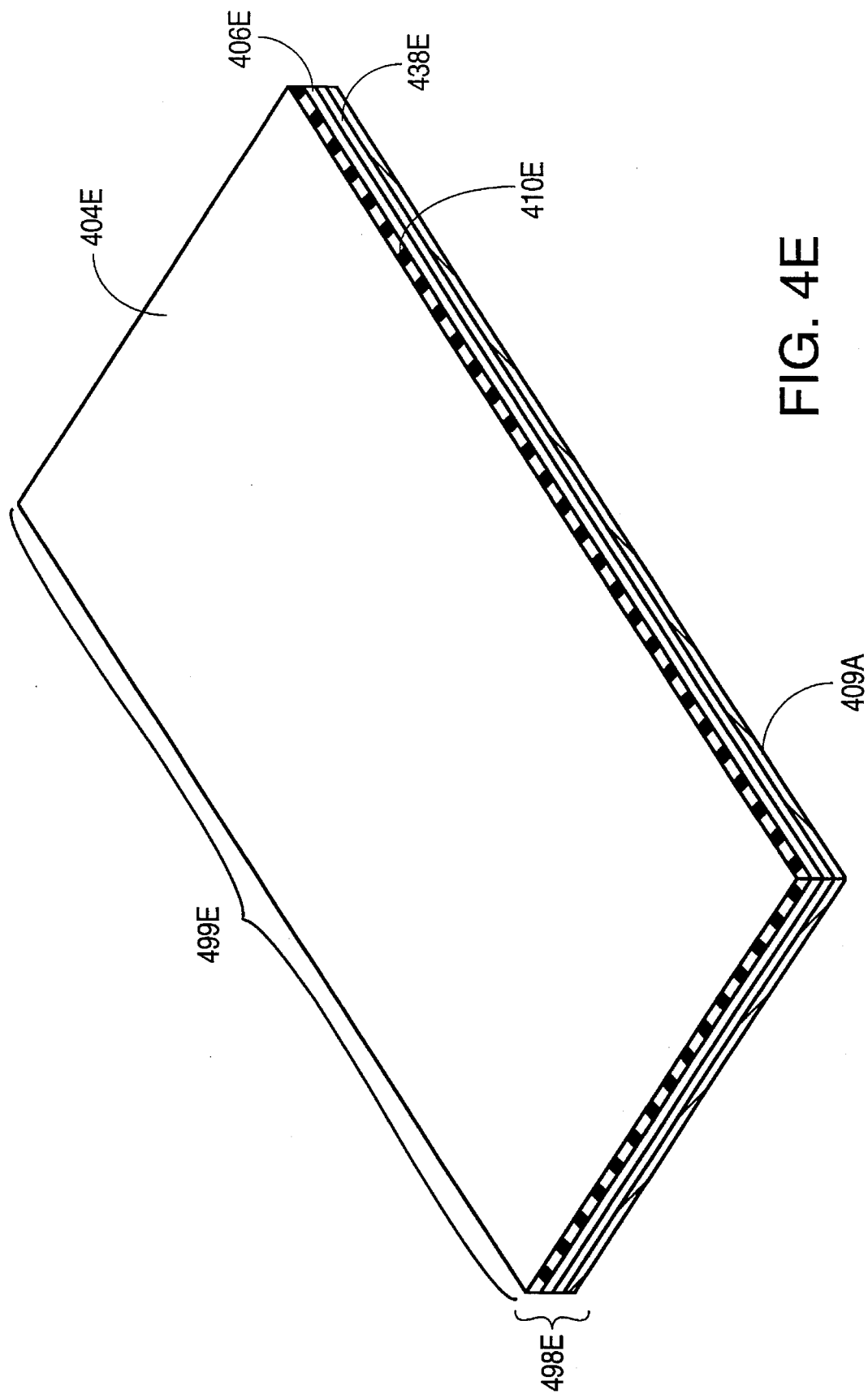
FIGS. 4E–4I depict some of the key steps of one method for manufacturing ball grid array packaged integrated circuit chips in accordance with the invention.
Figure 4F:
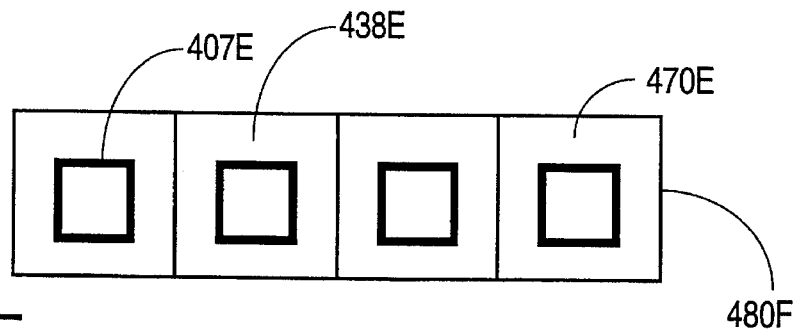
Figure 4G:
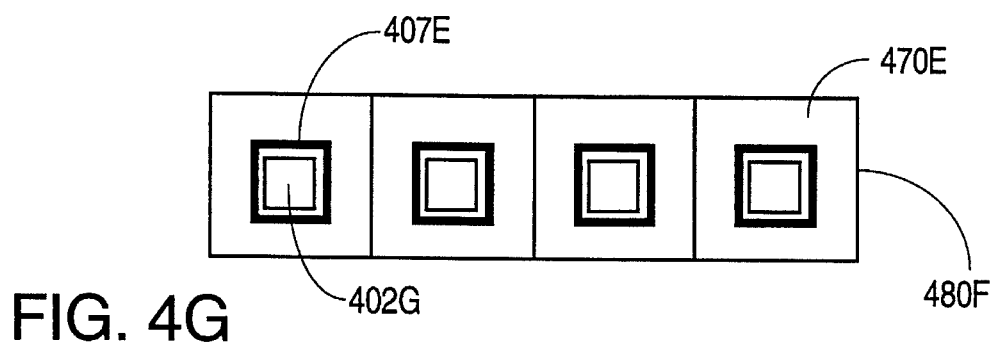

Then thermal conductor panel 404E is attached to panel of interconnection substrates 498E by adhesive layer 410E ( See FIGS. 4A and 4E) to form a panel of package units 499E (also referred to as panel 499E). As with thermal conductor panel 204E, thermal conductor panel 404E is a thin, typically 0.127 to 0.254 millimeters thick, sheet which is made of spring temper copper. FIG. 4E shows one perspective of panel 499E including thermal conductor panel 404E, adhesive layer 410E, panel of interconnection substrates 498E with insulating layer 406E, and conductive trace layer 438E, and solder mask layer 409A. As described above, thermal conductor panel 404E can include an adhesion layer of black oxide or another suitable material (not shown).

Figure 4H:
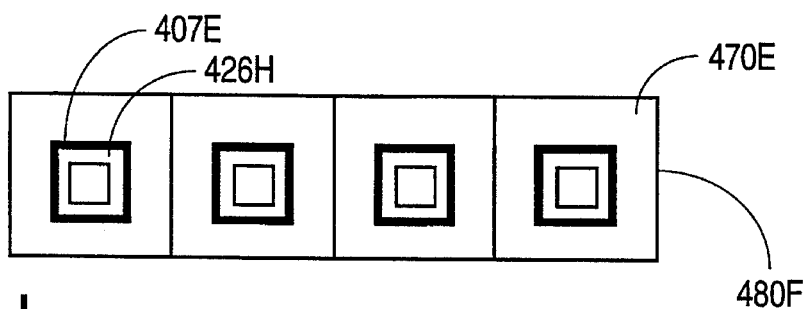
Figure 4I:
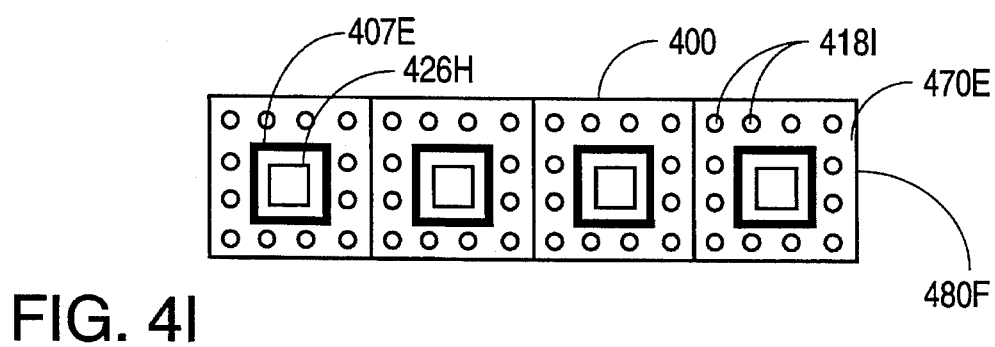

At this point, instead of creating well regions 236E, as was the done with panel of interconnection substrates 208E (FIG. 2E), dams 407E are applied (FIG. 4E2). Dams 407E are applied by any one of the various methods described above, to solder mask layer 409A (See FIG. 4A and 4E) on second surface 409E of panel 499E to form well regions 408E FIG. 4E2 shows second surface 409E of panel 499E. At this stage of production, panel 499E consists of empty ball grid array package units 470E, including well regions 408E created by dams 407E. As with panel 299E, panel 499E is then formed into strips of package units 480F (also referred to as strips 480F) (FIG. 4F) of individual package units 470E. Once strips 480F are formed, integrated circuit chips 402G are connected in flip chip configuration (FIG. 4G) and underfill material 426H is introduced (FIG. 4H). Finally, solder balls 418I can be applied (FIG. 4I), if desired, as described above, and the individual ball grid array packages 400 are marked and punched out.

Thus, ball grid array package 400, like ball grid array packages 200 and 300, can be mass produced in a panel and strip format on equipment already available in the integrated circuit industry. Of course, ball grid array package 400D can be produced by a method almost identical to that described above by adding additional insulating layer 414 and conductive trace layers 412 (FIG. 4D) to panel of interconnection substrates 498E (FIG. 4E). Furthermore, like ball grid array packages 200 and 300, ball grid array packages 400 and 400D can be produced by other methods known to those of skill in the art such as reel to reel printed circuit board manufacturing.

Figure 4J:
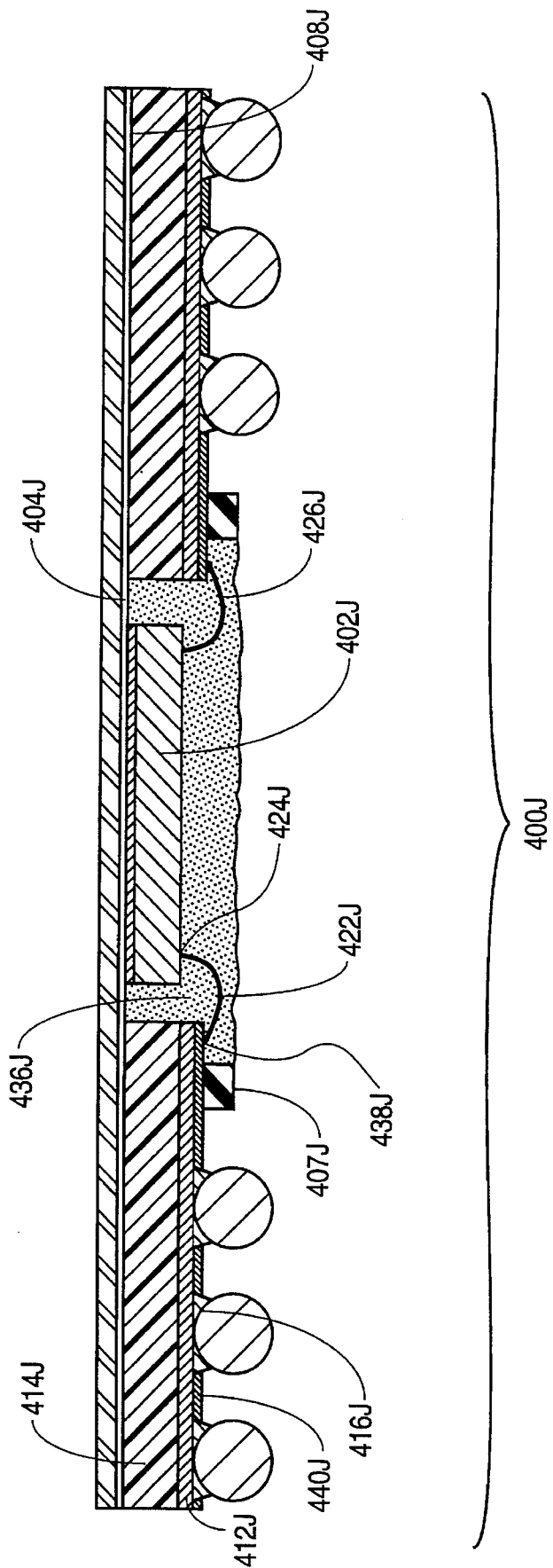
FIG. 4J is a cross-sectional view of a low cost wire bond ball grid array package 400J with integrated circuit chip 402J, dam 407J, and thermal conductor 404J in accordance with the present invention.

A dam, such as dam 407, can also be incorporated into a low cost wire bond version of a ball grid array package in accordance with the invention. FIG. 4J is a cross-sectional view of a wire bond version of a ball grid array package 400J with integrated circuit chip 402J and thermal conductor 404J in accordance with the invention. Ball grid array package 400J is similar to ball grid array package 200 (FIG. 2A) except that ball grid array package 400J is a lower cost and thinner package which includes only one insulating layer 414J, one conductive trace layer 412J, and solder mask layer 440J. As with the previous embodiments, the outer layer of ball grid array package 400J consists of thermal conductor 404J, attached with adhesive layer 410J. Since ball grid array package 400J only has a single conductive trace layer 412J, there is no need for conductive vias or plated through holes 220 such as described above (FIG. 2A). This makes ball grid array package 400J particularly simple and inexpensive to produce.

As with ball grid array package 200, integrated circuit chip 402J is positioned in a well region 436J. Since ball grid array package 400J is a wire bond configuration, bond wires 422J make the electrical connection between integrated circuit chip contact pads 424J and bonding locations 438J on conductive trace layer 412J. Since interconnection substrate 408J is very thin (typically 0.36 millimeters), it is necessary to include dam 407J to allow introduction of enough insulating encapsulant material 426J to cover bond wires 422J. Dam 407J, like dam 407 (FIG. 4A), contains and restricts the spreading of insulating encapsulant material 426J.

Ball grid array package 400J can be produced by the method described above with respect to ball grid array package 200 except that dam 407J must be applied in a separate, additional step. Of course, as described above, for production of ball grid array package 400J, panel of interconnection substrates 208E (FIG. 2E) consists of a single insulating layer 414J, adhesive layer 410J, a single conductive trace layer 412J, solder mask layer 440J, electrical contacts 416J, and no conductive vias or plated through holes. This simple structure makes ball grid array package 400J an easily produced and very low cost unit.

Figure 4K:
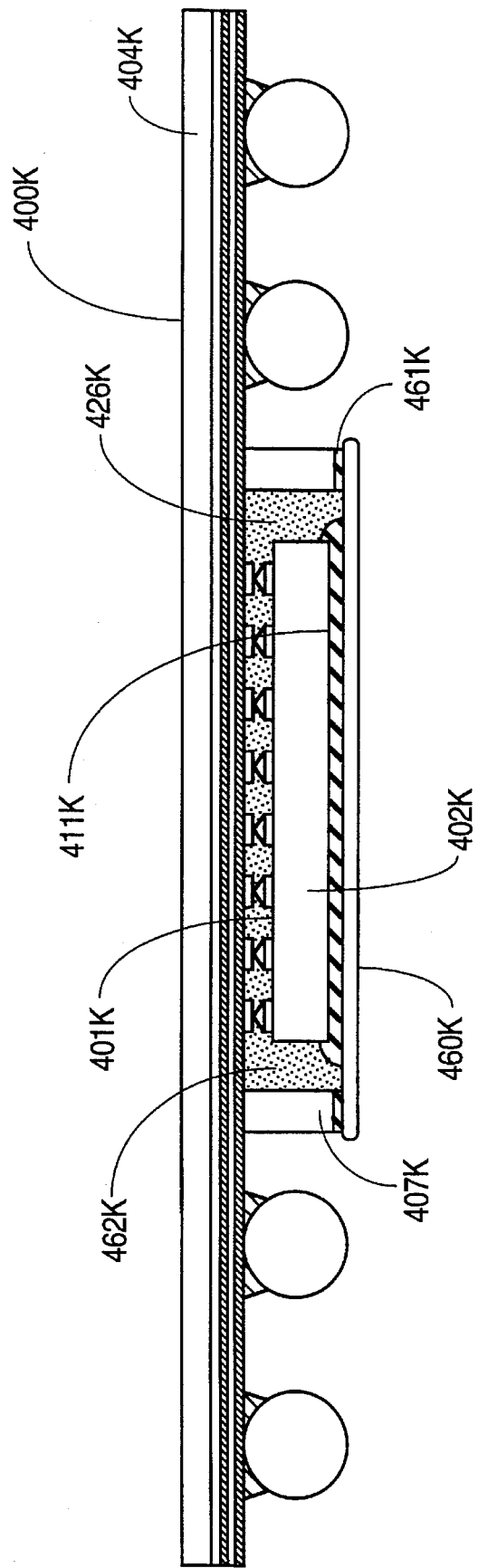
FIG. 4K is a cross-sectional view of a ball grid array package 400K with integrated circuit chip 402K, dam 407K, and thermal conductor 404K in accordance with the invention which incorporates a lid 460K.
Figure 4L:
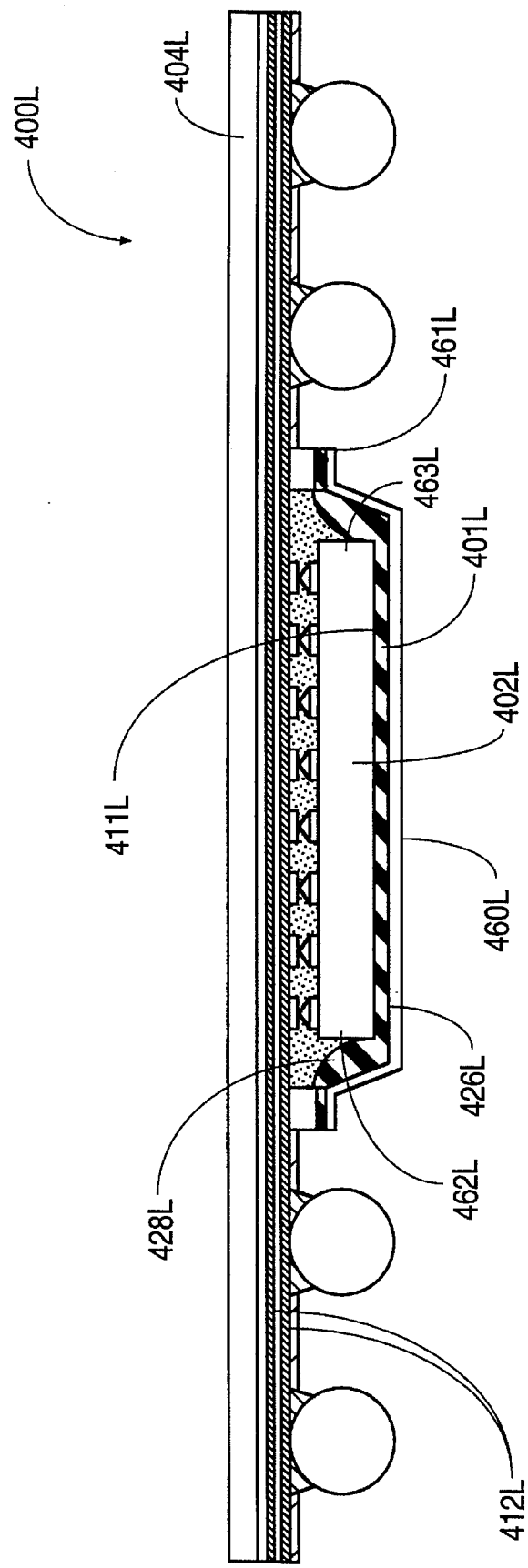
FIG. 4L is a cross-sectional view of a second embodiment of a ball grid array package 400L with integrated circuit chip 402L and thermal conductor 404L in accordance with the invention which incorporates a lid 404L.

FIGS. 4K and 4L are two more embodiments of ball grid array packages 400K and 400L, respectively, in accordance with the invention. These embodiments incorporate lids 460K and 460L, respectively.

FIG. 4K is a cross sectional view of ball grid array package 400K with thermal conductor 404K in accordance with the invention. In basic design, ball grid array package 400K is identical to ball grid array package 400D and, therefore, the description above of ball grid array packages 400 and 400D is not repeated here. However, ball grid array package 400K incudes a lid 460K which is attached to dam 407K with adhesive 461K.

Lid 460K encloses integrated circuit chip 402K to form, together with dam 407K and the structure associated with thermal conductor 404K, integrated circuit chip compartment 462K. For further protection, integrated circuit chip compartment 462K can be filled with protective insulating material 426K. Lid 460K can, in one configuration, be a second thermal conductor made of copper or another thermally conductive material. In this configuration, both surfaces 401K and 411K of integrated circuit chip 402K are in thermal contact with thermal conductors 404K and 460K, respectively. Therefore, even more heat can be dissipated away from integrated circuit chip 402K and ball grid array package 400K.

FIG. 4L is a cross sectional view of a ball grid array package 400L with thermal conductor 404L. Ball grid array package 400L is similar to ball grid array package 400K except that ball grid array package 400L does not include dam 407L. Lid 460L is cup-shaped so as to be attached directly to solder mask layer 412L by adhesive 461L. Like lid 260K, lid 460L can be a thermal conductor made of copper with the result that integrated circuit chip 402L is surrounded, including sides 462L and 463L, with thermal conductors 402L and 460L. This configuration allows for increased heat dissipation from all surfaces 401L, 411L, 462L and 463L of integrated circuit chip 402L. Further, the region under lid 460L can be filled with underfill material 428L and/or insulating encapsulant material 426L if desired.

Of course, ball grid array packages 400K and 400L are more expensive to produce than the structures shown in FIGS. 4A–4E, for example. However, where increased heat dissipation and improved integrated circuit protection are required, these ball grid array packages are a practical solution. Further, those skilled in the art will recognize that other structures and/or processes could be employed to enclose the integrated circuit chip.

As shown above, ball grid array packages 200, 200A, 300, 400, 400D, 400J, 400K, and 400L have all the advantages of prior art ball grid array packages including: low production cost, elimination of prior art difficulties in surface mounting fine pitch plastic packages, elimination of the need to directly route package leads to the outer edges of the integrated circuit package, smaller packages, capability for very close spacing of packages mounted to the same printed circuit board with high interconnection density and, shorter interconnect lengths which results in improved electrical performance.

In addition to the advantages above, the ball grid array packages of the present invention have superior heat dissipation characteristics because the thermal conductor is applied as a linearly co-extensive outer layer to the interconnection substrate. The resulting structure has several advantages. First, because the thermal conductor constitutes the entire outer surface layer of the ball grid array package, heat generated by the integrated circuit chip is spread evenly across the entire outer surface of the ball grid array package. Second, the thermal conductor has a maximum horizontal surface area exposed and therefore can be thinner and dissipate more heat away from the integrated circuit chip. Third, there is no shortened path for contamination, making package integrity more secure. Fourth, the thermal conductor serves to strengthen and support the interconnection substrate and, as a result, the interconnection substrate, and the entire ball grid array package, can be made thinner, without warping. Fifth, the thermal conductor acts as a shield against electro-magnetic radiation. Finally, the ball grid array packages of the present invention can be produced in a panel and strip format which significantly reduces the cost per unit.

Thus, the ball grid array packages in accordance with the present invention have the benefits of low production costs and superior environment isolation without the heat dissipation and structural problems of prior art packages. This makes the ball grid array packages according to the present invention ideal for packaging new generations of integrated circuit chips for use in small-size, light weight, electronic products such as those that have come to dominate the modern electronics market.

A detailed description of several embodiments of the present invention and their methods of manufacture is provided above. While the description of the invention has been made with reference to these specific embodiments and methods, the description is only illustrative of the invention and is not to be construed as limiting the invention. Various modifications can be made to the above described embodiments and methods by those skilled in the art without departing from the true spirit and scope of the invention as defined by the appended claims.

We claim:

1. A packaged integrated circuit device, comprising:

an interconnection substrate having one layer of conductive trace material and one layer of insulating material formed in or on said interconnection substrate, wherein said interconnection substrate has a first surface and a second surface opposite said first surface, said second surface of said interconnection substrate having a plurality of electrical contacts arranged in rows that are electrically connected to said one layer of conductive trace material for making electrical connections from said conductive trace material to contact points external to said packaged integrated circuit device;

a metallic thermal conductor, said thermal conductor having a first surface attached to said first surface of said interconnection substrate, said thermal conductor having a second surface opposite said first surface, which is exposed to the exterior of said packaged integrated circuit device, wherein a thickness of said thermal conductor between said first surface and said second surface of said thermal conductor is less than 1.0 millimeter, and said thermal conductor is linearly co-extensive with said interconnection substrate first surface;

a well region formed in said interconnection substrate, said well region having a bottom which is an exposed portion of said first surface of said thermal conductor;

an integrated circuit chip, said integrated circuit chip having a first surface and a second surface opposite said first surface, said integrated circuit chip being attached in said well region such that said second surface of said integrated circuit chip and said portion of said first surface of said thermal conductor exposed at said bottom of said well region are adhesively attached; and a plurality of conductive bond wires, said bond wires making electrical connections between said integrated circuit chip and bonding locations on said one layer of conductive trace material, wherein said packaged integrated circuit device has a thickness of less than 2.3 millimeters.

2. The packaged integrated circuit device of claim 1, wherein:

said first surface of said thermal conductor is treated to form an adhesion layer.

3. The packaged integrated circuit device of claim 2, wherein:

said adhesion layer is a black oxide layer.

4. The packaged integrated circuit device of claim 1, wherein:

said thermal conductor is copper.

5. The packaged integrated circuit device of claim 1, wherein:

said thermal conductor is aluminum.

6. The packaged integrated circuit device of claim 1, wherein:

said plurality of electrical contacts on said second surface of said interconnection substrate are balls.

7. The packaged integrated circuit device of claim 6, wherein:

said plurality of balls on said second surface of said interconnection substrate are solder balls.

8. The packaged integrated circuit device of claim 1, wherein:

said interconnection substrate further comprises:

two or more layers of insulating material; and two or more layers of conductive trace material, wherein each of said two or more layers of insulating material alternate with each of said two or more layers of conductive trace material; and said two or more layers of conductive trace material are electrically connected to said plurality of electrical contacts for making electrical connections from said conductive trace material to contact points external to said packaged integrated circuit device.

9. The packaged integrated circuit device of claim 8, wherein:

said interconnection substrate further comprises: a metal layer attached to said thermal conductor, wherein said one layer of insulating material is attached to said metal layer; and said one layer of conductive trace material is attached to said insulating layer.

10. The packaged integrated circuit device of claim 1, further comprising:

a lid, said lid being positioned and attached to said second surface of said interconnection substrate such that said lid covers said well region of said interconnection substrate, said integrated circuit chip, and said plurality of conductive bond wires.

11. The packaged integrated circuit device of claim 1, wherein:

said well region of said interconnection substrate is filled to a predetermined level with an electrically insulating encapsulant material such that said bond wires and said integrated circuit chip are covered by said electrically insulating encapsulant material.

12. The packaged integrated circuit device of claim 11, further comprising:

a dam positioned around the perimeter of said well region of said interconnection substrate to contain said insulating encapsulant material.

13. The packaged integrated circuit device of claim 12, wherein:

said dam is a plastic resin.

14. The packaged integrated circuit device of claim 12, wherein:

said dam is a tape.

15. The packaged integrated circuit device of claim 12, wherein:

said interconnection substrate further comprises: a metal layer attached to said thermal conductor, wherein said one layer of insulating material is attached to said metal layer; and said one layer of conductive trace material is attached to said insulating layer.

16. The packaged integrated circuit device of claim 15, wherein:

said metal layer of said interconnection substrate is copper.

17. The packaged integrated circuit device of claim 12, wherein:

said interconnection substrate further comprises:

two or more layers of insulating material; and two or more layers of conductive trace material, wherein each of said two or more layers of insulating material alternate with each of said two or more layers of conductive trace material; and said two or more layers of conductive trace material are electrically connected to said plurality of electrical contacts for making electrical connections from said conductive trace material to contact points external to said packaged integrated circuit device.

18. A packaged integrated circuit device, comprising:

a metallic thermal conductor, said thermal conductor having a first surface and a second surface opposite said first surface, which is exposed to the exterior of said packaged integrated circuit device, a thickness of said thermal conductor between said first surface and said second surface being less than 1.0 millimeter;

a first insulating layer, said first insulating layer being applied directly to said first surface of said thermal conductor;

a first layer of conductive trace material, said first layer of conductive trace material being applied over said first insulating layer;

an interconnection substrate having one layer of conductive trace material and one layer of insulating material formed in or on said interconnection substrate, wherein said interconnection substrate has a first surface and a second surface opposite said first surface, said first surface of said interconnection substrate being attached to said first layer of conductive trace material, said second surface of said interconnection substrate having a plurality of electrical contacts arranged in rows for making electrical connections from said first layer of conductive trace material and said one layer of conductive trace material to contact points external to said packaged integrated circuit device, wherein said thermal conductor is linearly co-extensive with said interconnection substrate;

a well region formed in said interconnection substrate, said well region having a bottom which is an exposed portion of said first conductive trace layer;

an integrated circuit chip, said integrated circuit chip having a first surface and a second surface opposite said first surface, said integrated circuit chip being attached in said well region in a flip-chip configuration such that said first surface of said integrated circuit chip is attached to said exposed portion of said first conductive trace layer at said bottom of said well region, wherein said packaged integrated circuit device has a thickness of less than 2.3 millimeters.

19. The packaged integrated circuit device of claim 18, wherein:

said first surface of said thermal conductor is treated to form an adhesion layer.

20. The packaged integrated circuit device of claim 19, wherein:

said adhesion layer is a black oxide layer.

21. The packaged integrated circuit device of claim 18, wherein:

said thermal conductor is copper.

22. The packaged integrated circuit device of claim 18, wherein:

said thermal conductor is aluminum.

23. The packaged integrated circuit device of claim 18, wherein:

said plurality of electrical contacts on said second surface of said interconnection substrate are balls.

24. The packaged integrated circuit device of claim 23, wherein:

said plurality of balls on said second surface of said interconnection substrate are solder balls.

25. The packaged integrated circuit device of claim 18, wherein:

said interconnection substrate further comprises:

two or more layers of insulating material; and two or more layers of conductive trace material, wherein each of said two or more layers of insulating material alternate with each of said two or more layers of conductive trace material; and said two or more layers of conductive trace material are electrically connected to said plurality of electrical contacts for making electrical connections from said conductive trace material to contact points external to said packaged integrated circuit device.

26. The packaged integrated circuit device of claim 18, further comprising:

a lid, said lid being positioned and attached to said second surface of said interconnection substrate such that said lid covers said well region of said interconnection substrate and said integrated circuit chip.

27. The packaged integrated circuit device of claim 18, wherein:

said well region of said interconnection substrate is filled to a predetermined level with an electrically insulating encapsulant material.

28. A packaged integrated circuit device, comprising:

a metallic thermal conductor, said thermal conductor having a first surface and a second surface opposite said first surface, which is exposed to the exterior of said packaged integrated circuit device, a thickness of said thermal conductor between said first surface and said second surface being less than 1.0 millimeter;

a first insulating layer, said first insulating layer being applied directly to said first surface of said thermal conductor;

a first layer of conductive trace material, said first layer of conductive trace material being applied over said first insulating layer;

an integrated circuit chip, said integrated circuit chip having a first surface and a second surface opposite said first surface, said integrated circuit chip being attached to a portion of said first conductive trace layer in a flip-chip configuration; and a dam, said dam being applied to said first layer of conductive trace material such that said dam is positioned around the perimeter of said integrated circuit chip, thereby creating a well region around said integrated circuit chip, wherein said packaged integrated circuit device has a thickness of less than 2.3 millimeters.

29. The packaged integrated circuit device of claim 28, further comprising:

a plurality of electrical contacts arranged in rows for making electrical connections from said first layer of conductive trace material to contact points external to said packaged integrated circuit device.

30. The packaged integrated circuit device of claim 29, wherein:

said first surface of said thermal conductor is treated to form an adhesion layer.

31. The packaged integrated circuit device of claim 30, wherein:

said adhesion layer is a black oxide layer.

32. The packaged integrated circuit device of claim 29, wherein:

said thermal conductor is copper.

33. The packaged integrated circuit device of claim 29, wherein:

said thermal conductor is aluminum.

34. The packaged integrated circuit device of claim 29, wherein:

said plurality of electrical contacts on said second surface of said interconnection substrate are balls.

35. The packaged integrated circuit device of claim 34, wherein:

said plurality of balls on said second surface of said interconnection substrate are solder balls.

36. The packaged integrated circuit device of claim 29, wherein:

said dam is a plastic resin.

37. The packaged integrated circuit device of claim 29, wherein:

said dam is a tape.

38. The packaged integrated circuit device of claim 29, wherein:

said well region around said integrated circuit chip, created by said dam, is filled to a predetermined level with an electrically insulating encapsulant material.

39. The packaged integrated circuit device of claim 28, further comprising:

a second insulating layer, said second insulating layer being applied over said first conductive trace layer; and a second conductive trace layer, said second conductive trace layer being applied over said second insulating layer, wherein said dam is applied to said second layer of conductive trace material such that said dam is positioned around the perimeter of said integrated circuit chip, thereby creating a well region around said integrated circuit chip.

40. The packaged integrated circuit device of claim 39, further comprising:

a plurality of electrical contacts arranged in rows for making electrical connections from said second layer of conductive trace material to contact points external to said packaged integrated circuit device.

\* \* \* \* \*